United States Patent
Wang et al.

(10) Patent No.: US 11,231,221 B2
(45) Date of Patent: Jan. 25, 2022

(54) TARGET MATERIAL SENSING USING RESONANT CIRCUIT WITH SENSING CAPACITOR AND ELECTRICAL ISOLATION

(71) Applicant: TEXAS INSTRUMENTS INCORPORATED, Dallas, TX (US)

(72) Inventors: Yichang Wang, Jiangsu (CN); Michael Seidl, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 366 days.

(21) Appl. No.: 16/129,956

(22) Filed: Sep. 13, 2018

(65) Prior Publication Data
US 2019/0331397 A1 Oct. 31, 2019

Related U.S. Application Data

(63) Continuation of application No. PCT/CN2018/084792, filed on Apr. 27, 2018.

(51) Int. Cl.
*G01R 27/26* (2006.01)
*F25D 21/06* (2006.01)
(Continued)

(52) U.S. Cl.
CPC ........... *F25D 21/02* (2013.01); *F25D 21/006* (2013.01); *F25D 21/06* (2013.01); *G01R 27/2605* (2013.01)

(58) Field of Classification Search
CPC .......... F25D 21/02; F25D 21/06; F25D 21/00; F25D 21/006; G01R 27/26; G01R 27/2605; G01D 5/24
See application file for complete search history.

(56) References Cited

U.S. PATENT DOCUMENTS

2004/0008040 A1* 1/2004 Wang ................. G01D 5/24
324/662
2008/0061965 A1* 3/2008 Kuhns ............... G06K 19/0717
340/539.22

(Continued)

FOREIGN PATENT DOCUMENTS

DE 242948 * 2/1987
GB 2496136 8/2013
(Continued)

OTHER PUBLICATIONS

U.S. Appl. No. 15/936,059, filed Mar. 26, 2018.
International Search Report in corresponding PCT Application No. PCT/CN2018/084792, dated Jan. 30, 2019 (4 pages).

*Primary Examiner* — Son T Le
(74) *Attorney, Agent, or Firm* — Ray A. King; Charles A. Brill; Frank D. Cimino

(57) ABSTRACT

A system includes a conductive element. The system also includes a resonant circuit having a sensing capacitor arranged such that an amount of target material in a sensing zone of the sensing capacitor changes a capacitance of the sensing capacitor, wherein the conductive element is electrically isolated from at least part of the resonant circuit. The system also includes a resonant circuit analyzer configured to detect a resonant frequency of the resonant circuit and to output a digitized analyzer signal based on the resonant frequency. The system also includes a processor configured to receive the digitized analyzer signal, to determine a target material estimate based on the digitized analyzer signal, and to output the target material estimate or a signal derived from the target material estimate to an output device.

20 Claims, 18 Drawing Sheets

(51) Int. Cl.
*F25D 21/02* (2006.01)
*F25D 21/00* (2006.01)

(56) References Cited

U.S. PATENT DOCUMENTS

| | | | |
|---|---|---|---|
| 2011/0084710 A1* | 4/2011 | Sussmeier | B43M 5/042 |
| | | | 324/663 |
| 2012/0055181 A1* | 3/2012 | Kim | F25D 21/006 |
| | | | 62/80 |
| 2013/0024169 A1 | 1/2013 | Veerasamy | |
| 2020/0003730 A1* | 1/2020 | Winecki | G01N 33/241 |

FOREIGN PATENT DOCUMENTS

| | | | |
|---|---|---|---|
| JP | 0213774 | | 1/1990 |
| JP | 02013774 A | * | 1/1990 |
| JP | 02298847 A | * | 12/1990 |
| JP | 2013134227 | | 1/2013 |

* cited by examiner

TARGET MATERIAL SENSING USING RESONANT CIRCUIT WITH SENSING CAPACITOR AND ELECTRICAL ISOLATION

BACKGROUND

As industry grows, the use of electronics plays an important role in obtaining raw materials, manufacturing of products, monitoring product functionality, and other uses. The use of sensors to monitor ongoing operations of passive or active parts of a larger system is a growing trend.

In an example scenario, refrigeration units provide cooling by heat exchange between cold outer surfaces of a heat exchanger with a fluid that is passed over the outer surface of the heat exchanger—for example, relatively warmer air. The warmer fluid loses energy to the relatively colder heat exchanger, thereby cooling the fluid. When the fluid is air, the eventuality of water vapor in the air condensing on the outer surface of the heat exchanger and forming frost and/or ice is possible. Many refrigeration units include a defrost mechanism to periodically reduce or eliminate frost/ice along the heat exchanger. However, such defrost mechanisms can be inefficient (wasting power) due to a lack of accurate information regarding the amount of frost/ice along the heat exchanger. Efforts to improve sensor technology to reduce harmful or wasteful scenarios, including inefficient use of a defrost mechanism in a refrigeration unit, are ongoing.

SUMMARY

In accordance with at least one example of the disclosure, a system comprises a conductive element. The system also comprises a resonant circuit having a sensing capacitor arranged such that variance of a target material in a sensing zone of the sensing capacitor changes a capacitance of the sensing capacitor, wherein the conductive element is electrically isolated from at least part of the resonant circuit (e.g., a GND node, a sensing channel node, an inductor node, or a capacitor node). The system also comprises a resonant circuit analyzer configured to detect a resonant frequency of the resonant circuit and to output a digitized analyzer signal based on the resonant frequency. The system also comprises a processor configured to receive the digitized analyzer signal, to determine a target material estimate based on the digitized analyzer signal, and to output the target material estimate or a signal derived from the target material estimate to an output device.

In accordance with at least one example of the disclosure, a refrigeration unit comprises a metal heat exchanger. The refrigeration unit also comprises a resonant circuit having a sensing capacitor arranged to vary its capacitance based on an amount of frozen water in a sensing zone of the sensing capacitor, wherein the metal heat exchanger is electrically isolated from at least part of the resonant circuit (e.g., a GND node, a sensing channel node, an inductor node, or a capacitor node). The refrigeration unit also comprises a resonant circuit analyzer configured to detect a resonant frequency of the resonant circuit and to output a digitized analyzer signal based on the resonant frequency. The refrigeration unit also comprises a processor configured to receive the digitized analyzer signal and to determine a frozen water estimate based on the digitized analyzer signal. The refrigeration unit also comprises a defrost unit configured to receive a control signal from the processor, wherein the control signal is based on a determined frozen water estimate.

In accordance with a least one example of the disclosure, an apparatus comprises a sensing capacitor with two opposing terminals and a sensing zone between the two opposing terminals, wherein variance of a target material in the sensing zone changes a capacitance of the sensing capacitor. The apparatus also comprises a metallic conduit to convey fluid. The apparatus also comprises at least one printed circuit board (PCB) comprising a ground node, a sensing channel node, and at least one LC component coupled between the sensing channel node and the ground node to complete a resonant circuit that includes the sensing capacitor, wherein the metallic conduit is electrically isolated from the ground node and the sensing channel node. The at least one PCB also comprises a resonant circuit analyzer configured to track a resonant frequency of the resonant circuit as a function of time and to output digitized analyzer signals based on the tracked resonant frequency as a function of time. The at least one PCB also comprises a processor configured to receive the digitized analyzer values and to determine target material estimates based on the digitized analyzer values.

BRIEF DESCRIPTION OF THE DRAWINGS

For a detailed description of various examples, reference will now be made to the accompanying drawings in which.

DETAILED DESCRIPTION

Figure 1:
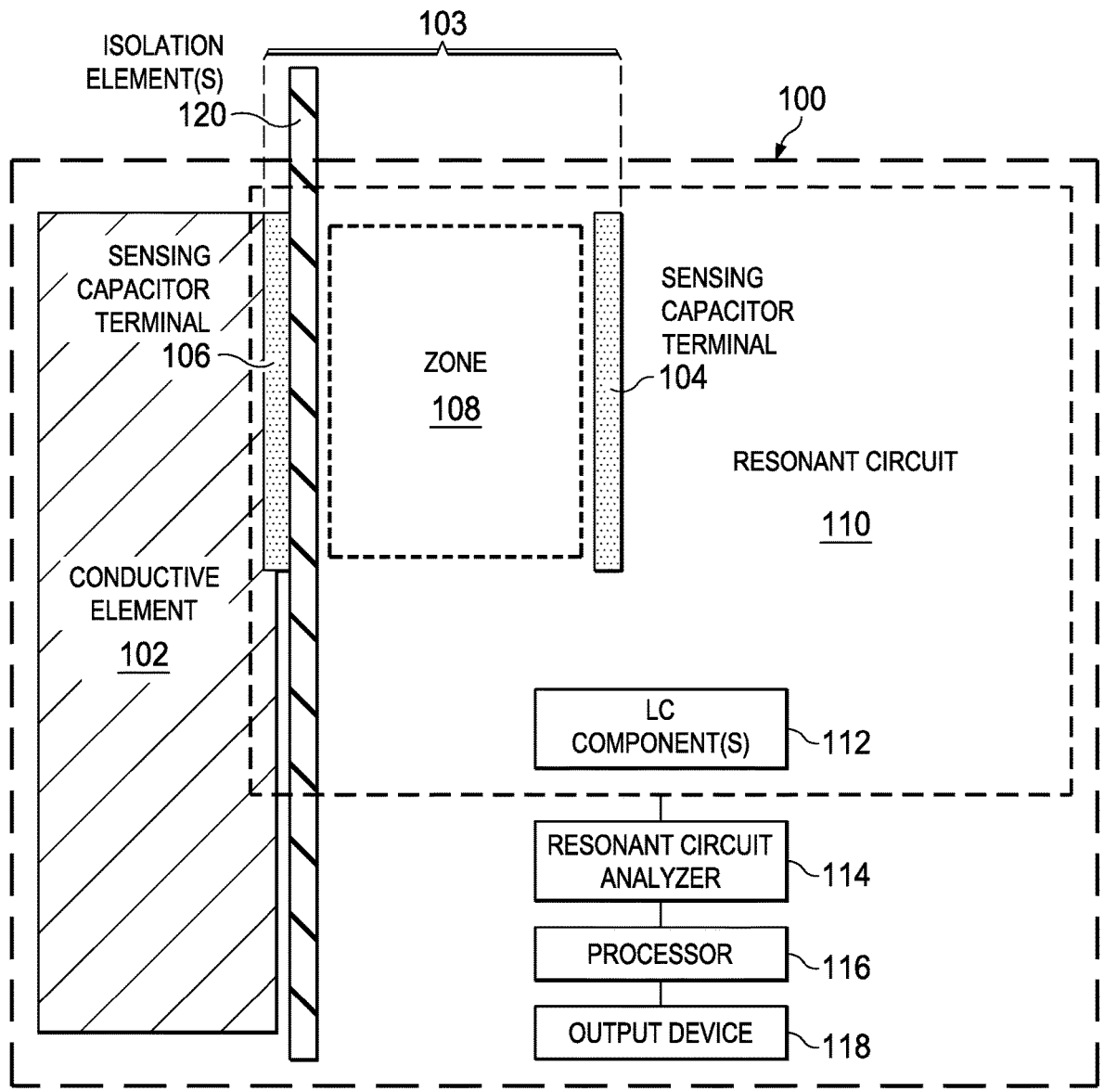
FIG. 1 shows a system with target material sensing components in accordance with various examples.

The disclosed examples are directed to target material sensing components. In various examples, the target material sensing components are part of a larger system, apparatus, or unit. In some examples, the target material sensing components include a resonant circuit with a sensing capacitor. The sensing capacitor is arranged such that variance of a target material in a sensing zone changes a capacitance of the sensing capacitor. This change in capacitance is due to the variance of the dielectric constant in the sensing zone of the sensing capacitor as the amount of target material (e.g., an increase or decrease) and/or the phase of the target material (e.g., a change from gas to liquid, or a change liquid to solid, etc.) in the sensing zone varies. The variance in capacitance of the sensing capacitor is detectable as a change in the resonant frequency of the resonant circuit that the sensing capacitor is part of. In the disclosed examples, a resonant circuit analyzer is used to track the resonant frequency of the resonant circuit that includes the sensing capacitor and to output digitized analyzer signals based on the resonant frequency. In various examples, the digitized analyzer signal includes at least one of a resonant frequency estimate and a sensing capacitor value estimate. The digitized analyzer signals are received by a processor in communication with the resonant circuit analyzer and are used, by the processor, to determine a target material estimate (e.g., an amount of the target material and/or a phase of the target material). In various examples, the target material estimate is expressed as at least one of a target material volume and a target material thickness. The processor provides the target material estimate or a signal derived from the target material estimate to an output device for use with presenting system information and/or correcting an unwanted system condition.

In various examples, target material sensing as described herein is employed in a refrigeration unit. In such examples, the output device corresponds to a defrost unit that is directed by signals from the processor, where the processor selects one or more control signals for the defrost unit based on target material estimates over time. In one example, the processor provides a start signal to the defrost unit, where the start signal is initiated by the processor based on a target material estimate. In another example, the processor provides a stop signal to the defrost unit, where the stop signal is initiated by the processor based on a target material estimate.

In various examples, target material sensing components are employed in a unit, a vehicle, a building, or another location to track build-up or reduction of a target material along a metallic conduit. In one example, target material sensing components track build-up or reduction of ice along a pipe (inside or outside the pipe) in a unit, a vehicle, a building, or outdoors. In another example, target material sensing components track build-up or reduction of mineral deposits along a pipe (inside or outside the pipe) in a unit, a vehicle, a building, or outdoors. In another example, target material sensing components track loss of pipe material itself over time. In another example, target material sensing components track phase changes of a target material along a pipe (inside or outside the pipe). In various examples, different phase conditions of interest (e.g., frozen pipes, air in water pipes, transitions between gas to liquid or vice versa) are detected in this way.

In various examples, the output device in a system enables a response to a determined target material estimate. In one example, the output device is a computer capable of displaying the target material estimate or related messages (e.g., "the thickness of target material X detected in the sensing zone of sensing capacitor Y is 6 mm", "the volume of target material X detected in the sensing zone of sensing capacitor Y is 15 mL", "WARNING: the amount of target material detected by sensing capacitor 2 is within 20% of a maximum threshold, etc.). The messages are viewable by an operator of the computer, and the same computer or another device subsequently initiates operations that remedy or account for the target material estimate in a particular sensing zone. In various embodiments, the computer that receives target material estimates runs software to handle responses to the target material estimates (with or without operator input). In other various examples, the output device corresponds to a printer, a speaker, and/or another audiovisual output device capable of presenting messages to individuals monitoring target material sensing results. Computers, printers, speakers, and other devices capable of presenting information to an operator are sometimes referred to herein as "display devices."

In various examples, target material sensing components are employed as part of a system that includes a conductive element (e.g., a metallic conduit or pipe). Due to the proximity of target material sensing components to the conductive element, there is some risk that assembly of system components will be hindered or will result in damaged electronic components. Accordingly, in various examples, the conductive element is electrically isolated from at least some of the resonant circuit that includes the sensing capacitor. There are different options to achieve electrical isolation of a conductive element. In various examples, an insulative material is placed between one or both terminals of a sensing capacitor and the conductive element. In other examples, at least one conductive surface of the conductive element is used as one of the terminals for the sensing capacitor. In such case, electrostatic discharge protection circuitry, such as a safety capacitor, is placed between the conductive element and at least some of the resonant circuit. In one example, the size of a safety capacitor is selected according to a predetermined capacitance value or range for a sensing capacitor (e.g., the safety capacitor is selected to be 10, 50, or 100 times larger than the highest or average expected capacitance for a sensing capacitor). In various examples, insulative materials and electrostatic discharge protection circuitry are used separately or together to provide electrical isolation of the conductive element relative to at least part of the resonant circuit (e.g., a GND node, a sensing channel node, an inductor node, or a capacitor node) used for target material sensing. To provide a better understanding, various target material sensing components, scenarios, and details are described using the figures as follows.

FIG. 1 shows a system 100 with target material sensing components in accordance with various examples. In various examples, the system 100 is representative of a unit (e.g., a refrigeration unit), a vehicle, a building, or a pipe network. As shown in FIG. 1, the system 100 comprises a sensing capacitor 103 with opposing terminals 104 and 106. Between the opposing terminals 104 and 106 of the sensing capacitor 103 is a sensing zone 108, where the dielectric constant of materials in the sensing zone 108 affects the capacitance of the sensing capacitor 103. Accordingly, as the amount or phase of a target material in the sensing zone 108 changes (e.g., the target material replaces another material in the sensing zone or vice versa), the dielectric constant of materials in the sensing zone 108 changes, resulting in a variable capacitance for the sensing capacitor 103.

In various examples, the materials, size (surface area), and position of the terminals 104 and 106 for the sensing capacitor 103 are selected to support a predetermined size and target material sensitivity for the sensing zone 108. In one example, the terminals 104 and 106 are constructed from at least one conductive material such as copper, aluminum, and steel. An example surface area for each of the terminals 104 and 106 is 5-20 cm$^2$, and an example sensing zone 108 enables detection of a target material thickness between 0-6 mm. Also, an example capacitance variance of the sensing capacitor 103 during sensing operations is on the order of several picofarads.

In system 100, the sensing zone 108 is adjacent to a conductive element 102 (e.g., a metal heat exchanger, pipe, or other metallic conduit), and is sometimes referred to herein as a "side" sensing zone herein. In various examples, to facilitate assembly and/or to protect electronic components (e.g., target material sensing components), isolation element(s) 120 are positioned between the conductive element 102 and at least some of the resonant circuit 110. In various examples, the isolation element(s) 120 corresponds to an insulative material between the conductive element 102 and at least one of the opposing terminals 104 and 106 of the sensing capacitor 103. The insulative material is attached, for example, to at least one of a surface (e.g., as a coating) of the conductive element 102, a surface of the terminal 104, and a surface of the terminal 106. In various other examples, the isolation element(s) 120 corresponds to at least one electrostatic discharge protection component (e.g., a safety capacitor) between the conductive element 102 and at least one the opposing terminals 104 and 106 of the sensing capacitor 103. In some examples, the size of the safety capacitor is selected based on the capacitance range of the sensing capacitor 103. As an example, if the sensing capacitor 103 has a capacitance range of several picofarads (e.g., up to 40 pF), a safety capacitor with a size of 1-10 nF is appropriate (e.g., the safety capacitor can be selected to be 10, 50, or 100 times larger than the maximum or average capacitance of the sensing capacitor 103). In some examples, insulative materials and electrostatic discharge protection components are used together to provide isolation element(s) 120.

As shown in FIG. 1, the sensing capacitor 103 is part of a resonant circuit 110 that includes the sensing capacitor 103 and LC component(s) 112. When the resonant circuit 110 is energized, the resonant frequency of the resonant circuit 110 is a function of the capacitance of the sensing capacitor 103. Therefore, as the capacitance of the sensing capacitor 103 changes (e.g., as the amount and/or phase of a target material in the sensing zone 108 changes), the resonant frequency of the resonant circuit 110 changes as well.

To track the resonant frequency of the resonant circuit 110, the system 100 employs a resonant circuit analyzer 114. In various examples, the resonant circuit analyzer 114 periodically provides energy to the resonant circuit 110, samples the resulting resonant frequency, and outputs digitized analyzer signals to a processor 116. Each digitized analyzer signal output by the resonant circuit analyzer 114 includes, for example, at least one of a resonant frequency (f) for the resonant circuit 110, a change in the resonant frequency ($\Delta$f) of the resonant circuit 110, a capacitance (C) of the sensing capacitor 103, and a change in the capacitance ($\Delta$C) of the sensing capacitor 103.

In operation, the processor 116 receives digitized analyzer signals from the resonant circuit analyzer 114 and determines a target material estimate based on one or more digitized analyzer signals. In various examples, the technique for target material estimation varies according to the information received from a digitized analyzer signal (e.g., f, $\Delta$f, C, $\Delta$C). As one example, the processor 116 estimates an amount of target material in the sensing zone 108 using a function or table that relates different f values to different amounts of the target material in the sensing zone 108. As another example, the processor 116 estimates an amount of target material in the sensing zone 108 using a function or table that relates different $\Delta$f values to different amounts of the target material in the sensing zone 108. As another example, the processor 116 estimates an amount of target material in the sensing zone 108 using a function or table that relates different C values to different amounts of the target material in the sensing zone 108. As another example, the processor 116 estimates an amount of target material in the sensing zone 108 using a function or table that relates different $\Delta$C values to different amounts of the target material in the sensing zone 108. In other examples, the target material estimate corresponds to an amount of gain or loss of target material in the sensing zone 108 rather than a total amount of target material in the sensing zone 108. In other examples, the target material estimate corresponds to a target material log that identifies a specific target material estimate for each of a plurality of time slots (e.g., one target material estimate for each hour of a 24-hour period).

In FIG. 1, the processor 116 communicates with an output device 118 to enable a response to a target material estimate. In some examples, the processor 116 provides a target material estimate to the output device 118. In other examples, the processor 116 provides a signal (e.g., an alert signal or control signal) to the output device 118, where the signal is derived from a determined target material estimate.

In one example, the output device 118 is a display device (e.g., a computer, printer, or speaker), and the processor 116 provides a determined target material estimate to the output device 118 to enable presentation of the determined target material estimate to an operator (e.g., the display device displays or otherwise identifies the determined target material estimate). As another example, the output device 118 is a display device that issues a warning or message to an operator in response to receiving, from the processor 116, a target material estimate or signal derived from a target material estimate.

In some examples, the system 100 is a refrigeration unit, and the output device 118 is a defrost unit that receives control signals from the processor 116. In this example, if the determined target material estimate indicates that more than a threshold amount of frozen water is present in the sensing zone 108 (e.g., a start defrost condition is detected based on a target material estimate), the processor 116 asserts a start control signal to the defrost unit, which triggers activation of heating elements to melt the frozen water. In various examples, the defrost unit employs a timer and/or a temperature sensor to determine when to end a defrost cycle. In other examples, the processor 116 determines when a target material estimate indicates that less than a threshold amount of frozen water is present in the sensing zone 108 (e.g., a stop defrost condition is detected based on a target material estimate). In response to detecting a stop defrost condition, the processor 116 asserts a stop control signal to the defrost unit, which triggers de-activation of heating elements.

In another example, the system 100 is a pipe network, and the output device is a target material removal unit. An example of a target material removal unit is a defrost unit. Another example of a target material removal unit is a scale removal unit designed to remove unwanted material deposits inside or outside of a pipe, where a portion of the pipe is positioned in the sensing zone 108 to detect build-up and reduction of mineral deposits. In other pipe network examples, the output device 118 is a display that displays information to enable operators to identify when pipes need to be replaced due to excessive build-up of mineral deposits or loss of pipe material. Both build-up of mineral deposits and loss of pipe material are detectable using target material sensing components by positioning a pipe of interest in the sensing zone 108. In FIG. 1, the sensing zone 108 is on the outside of the conductive element 102 to provide sensitivity to target material variance along the outside of the conductive element 102. Meanwhile, in FIG. 2, the sensing zone 208 enables monitoring of target material variance inside or outside a conductive element 202.

Figure 2:
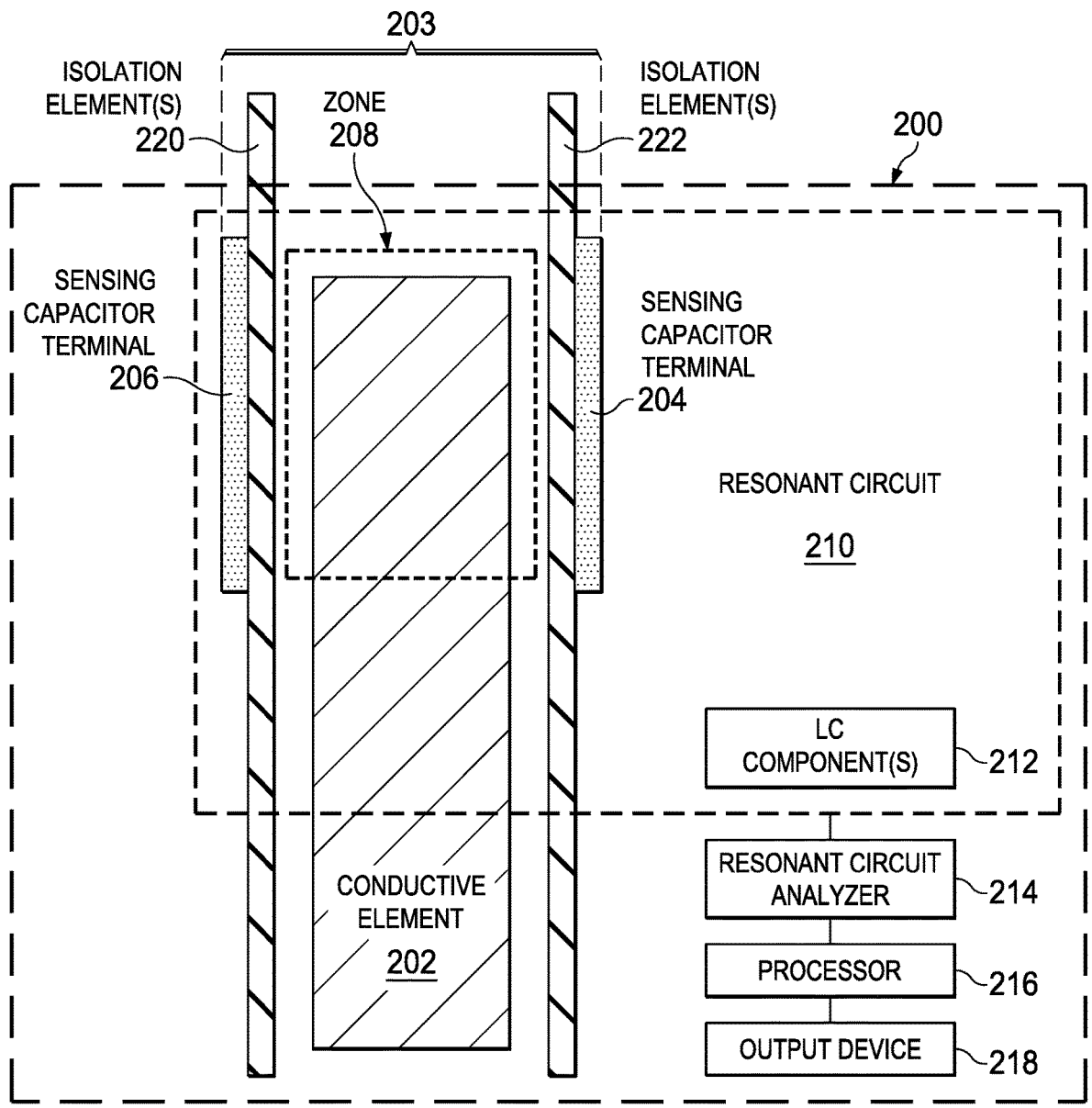
FIG. 2 shows another system with target material sensing components in accordance with various examples.

In FIG. 2, another system 200 with target material sensing components is represented. In various examples, the system 200 is representative of a unit (e.g., a refrigeration unit, a vehicle, a building, or a pipe network). As shown, the system 200 is different than system 100 at least due to the sensing zone 208 being positioned differently than the sensing zone 108 of system 100. More specifically, for system 100 in FIG. 1, the terminals 104 and 106 of the sensing capacitor 103 are on the same side of the conductive element 102, resulting in the sensing zone 108 being a "side" sensing zone relative to the conductive element 102. In contrast, for system 200 of FIG. 2, the terminals 204 and 206 of the sensing capacitor 203 are on opposite sides of the conductive element 202, resulting in the sensing zone 208 being a "through" sensing zone relative to the conductive element 202. The "through" sensing zone represented by sensing zone 208 includes space inside the conductive element 202 as well as some space on opposite sides of the conductive element 202. In various examples, the materials used, the size, and the capacitance range discussion for sensing capacitor 103 in FIG. 1 (e.g., materials used, size, and capacitance range) applies to the sensing capacitor 203 of FIG. 2. However, it should be understood that sensing capacitor arrangements for "side" sensing zones (e.g., sensing zone 108 in FIG. 1) and for "through" sensing zones (e.g., sensing zone 208 in FIG. 2) will possibly vary with regard to size, spacing, and target material sensitivity, especially if one or more surfaces of a conductive element is used as a sensing capacitor terminal as discussed later.

As shown in FIG. 2, the system 200 includes isolation element(s) 220 and 222 between the conductive element 202 and each terminal 204 and 206 of the sensing capacitor 203. In at least some examples, the isolation element(s) 220 and 222 are examples of isolation element(s) 120 introduced in FIG. 1, and thus the discussion for isolation element(s) 120 of FIG. 1 applies to the isolation element(s) 220 and 222 of FIG. 2. Likewise, in at least some examples, the discussion of resonant circuit 110, resonant circuit analyzer 114, processor 116, and output device 118 in FIG. 1 applies to the resonant circuit 210, resonant circuit analyzer 214, processor 216, and output device 218 in FIG. 2. The difference to be noted between system 100 of FIG. 1 and system 200 of FIG. 2 relates to the sensing zone 108 being a "side" sensing zone relative to the conductive element 102, whereas sensing zone 208 is a "through" sensing zone relative to the conductive element 202. Regardless of whether a sensing zone is a "side" sensing zone or a "through" sensing zone relative to a particular conductive element, the size of a sensing zone can be adjusted by selecting appropriate sensing capacitor parameters.

Relevant constraints to sensing zone size include the position of outer housing material for a system, the position of internal components for a system (besides target material sensing components), the diameter of metallic conduits (e.g., for "through" sensing zones), the expected amount of target material before a response is needed, and the desired target material sensitivity and resolution. To increase target material sensing resolution, the surface area of opposing terminals for a sensing capacitor is increased and/or the distance between the opposing terminals is decreased. To decrease target material sensing resolution, the surface area of opposing terminals for a sensing capacitor is decreased and/or the distance between the opposing terminals is increased.

Figure 3A:
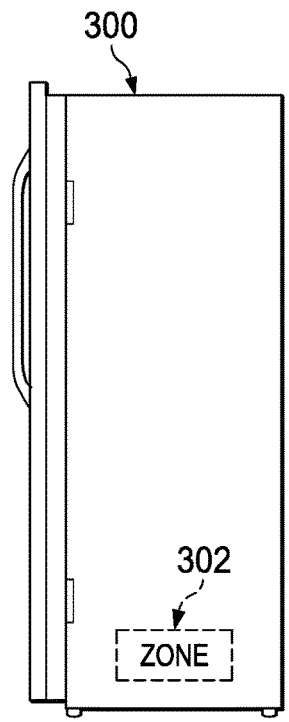
FIGS. 3A-3C show different sensing zone scenarios in accordance with various examples.
Figure 3B:
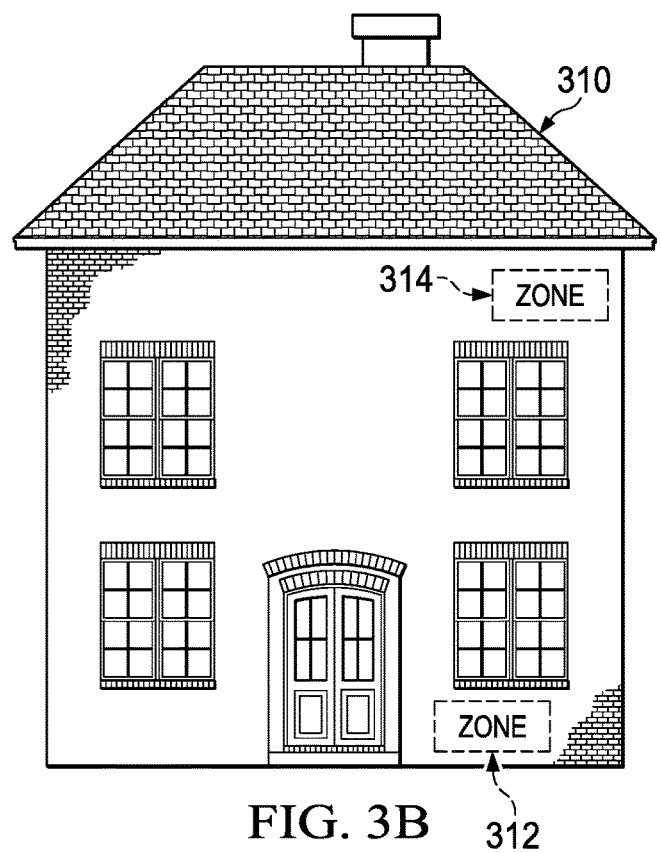
Figure 3C:
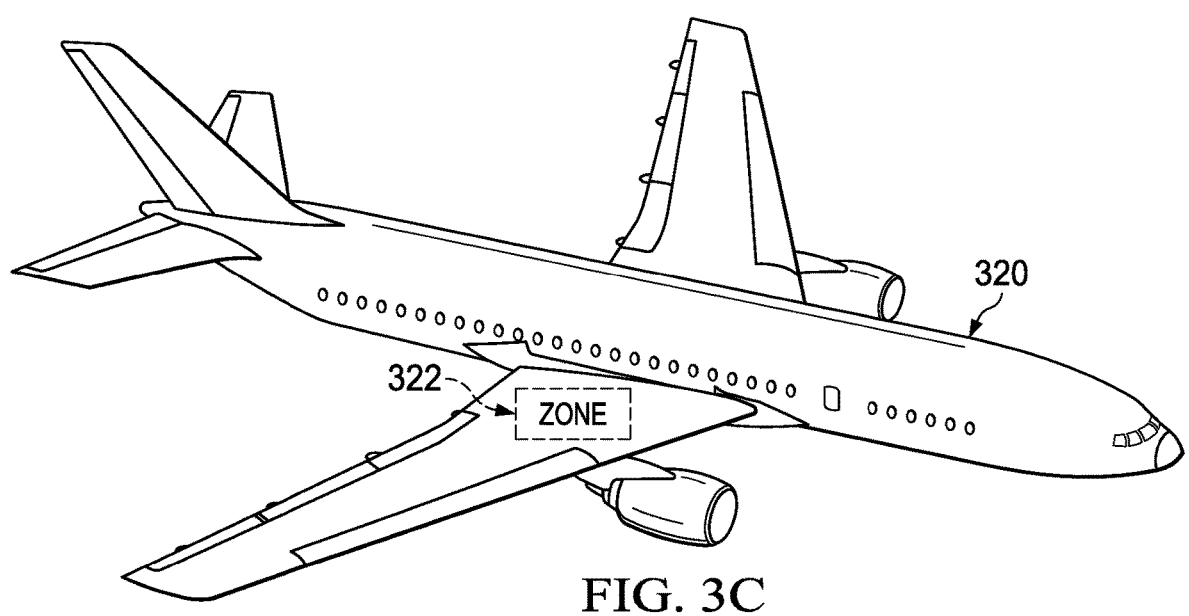

FIGS. 3A-3C show different sensing zone scenarios in accordance with various examples. In FIG. 3A, a refrigeration unit 300 with a sensing zone 302 is represented. In some examples, the sensing zone 302 corresponds to a "side" sensing zone (e.g., sensing zone 108). In other examples, the sensing zone 302 corresponds to a "through" sensing zone (e.g., sensing zone 208). While FIG. 3A shows the position of the sensing zone 302 near the bottom of the refrigeration unit 300, it should be understood that the position of the sensing zone 302 varies for other refrigeration units. Further, in various examples, a refrigeration unit, such as the refrigeration unit 300, includes multiple sensing zones (e.g., multiple "side" sensing zone, multiple "through" sensing zones, or a combination of "side" and "through" sensing zones). In FIG. 3A, the refrigeration unit 300 represents a refrigerator and/or freezer. In other examples, a refrigeration unit with one or more sensing zones is part of an air conditioning system.

In FIG. 3B, a building 310 with sensing zones 312 and 314 is represented. In some examples, the sensing zones 312 and 314 correspond to "side" sensing zones (e.g., sensing zone 108). In other examples, the sensing zones 312 and 314 corresponds to "through" sensing zones (e.g., sensing zone 208). In other examples, the sensing zone 312 is a "side" sensing zone and the sensing zone 314 is a "through" sensing zone, or vice versa. While FIG. 3B shows the position of the sensing zone 312 near the bottom of the building 310 and the position of the sensing zone 314 nearer to the top of the building 310, it should be understood that the position of the sensing zones 312 and 314 may vary. Further, in various examples, a building such as building 310 includes a single sensing zone. In FIG. 3B, the building 310 represents a house. In other examples, another type of building (e.g., a commercial building, a university building, or a government building) includes one or more sensing zones.

In FIG. 3C, a vehicle 320 with a sensing zone 322 is represented. In some examples, the sensing zone 322 corresponds to a "side" sensing zone (e.g., sensing zone 108). In other examples, the sensing zone 322 corresponds to a "through" sensing zone (e.g., sensing zone 208). While FIG. 3C shows a given position for the sensing zone 322, it should be understood that the position of the sensing zone 322 may vary. Further, in various examples, the vehicle 320 includes multiple sensing zones (e.g., multiple "side" sensing zone, multiple "through" sensing zones, or a combination of "side" and "through" sensing zones). In FIG. 3C, the vehicle 320 represents a commercial airplane. In other examples, a vehicle with one or more sensing zones corresponds to a car, a truck, or a military vehicle.

Figure 4A:
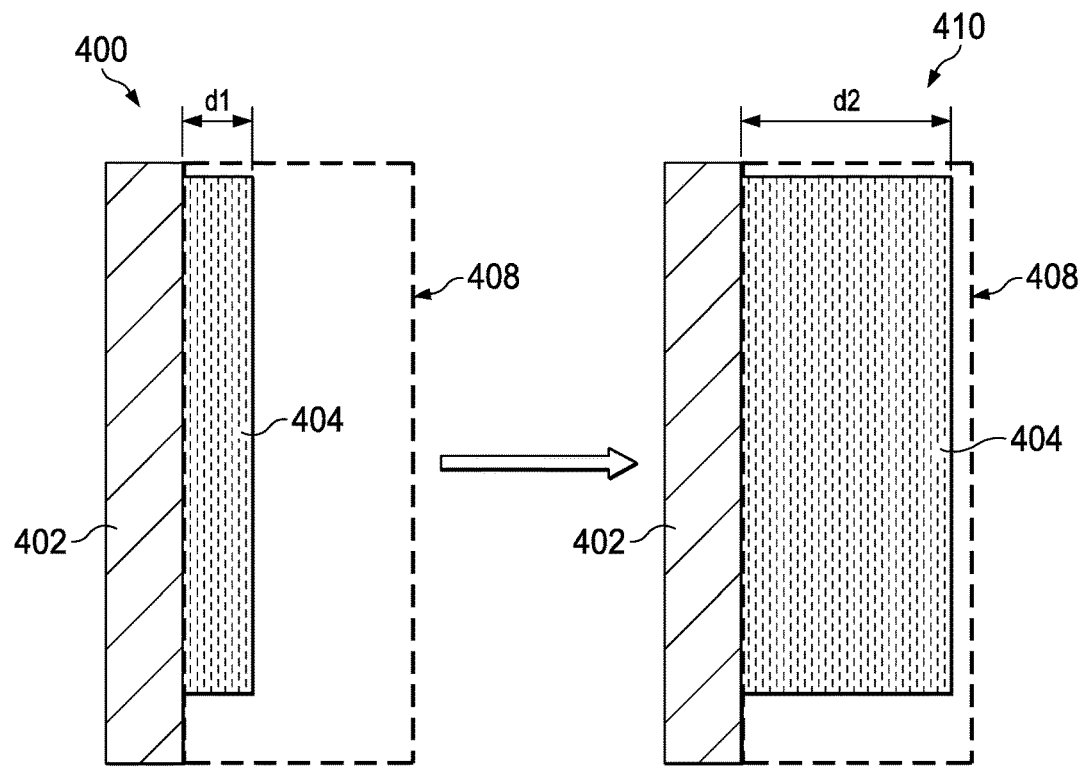
FIGS. 4A-4E shows target material sensing scenarios in accordance with various examples.

FIGS. 4A-4E show target material sensing scenarios in accordance with various examples. In FIG. 4A, scenario 400 shows a "side" sensing zone 408 relative to a conductive element 402, where a target material 404 in the "side" sensing zone 408 has a thickness d1 (e.g., 3 mm). At a later time represented in scenario 410, the target material 404 has another thickness, d2, that is larger than d1 (e.g., d2=6 mm in scenario 410). In some examples, target material sensing as described herein is performed to estimate values for d1 and/or d2. In other examples, target material sensing as described herein is performed to estimate a value for d2−d1 (the amount of increase in thickness of the target material 404 for scenario 410 relative to scenario 400). In other examples, target material sensing as described herein is performed to estimate target material volumes associated with d1 and/or d2. In other examples, target material sensing as described herein is performed to estimate a target material volume associated with d2−d1 (the amount of increase in volume of the target material 404 for scenario 410 relative to scenario 400).

In some examples, volume estimation is limited to target material volumes inside the "side" sensing zone 408. In other examples, volume estimation involves target material volumes inside and outside the "side" sensing zone 408. In one example, if the "side" sensing zone 408 represents 5% of a system area subject to target material variance, then a target material estimate for the entire system area is calculated by multiplying a volume estimate for the "side" sensing zone 408 by a proportional factor such as twenty (the inverse of 5%). As another example, if the "side" sensing zone 408 represents 5% of a system area subject to target material variance, and it is known that the target material volume in the "side" sensing zone 408 is 10% higher on average than target material volumes in the rest of the system area, then a target material estimate for the entire system area is calculated by multiplying a volume estimate for the "side" sensing zone 408 by a proportional factor (nineteen or twenty for this example) and a distortion factor (0.9 for this example) that accounts for variance between target material behavior in the "side" sensing zone 408 relative to target material behavior in other portions of a system area. In one example, the total volume for a system area is:

$$V\text{system\_area} = V\_\text{zone\_1} + \text{proportional factor} * \text{distortion factor} * V\_\text{zone\_1},$$

where Vsystem_area is the total volume of a target material for a given system area, V_zone_1 is the estimated volume of the target material for a specific sensing zone in the given system area, the proportional factor is a factor that accounts for target material outside the specific sensing zone, and the distortion factor accounts for variance between the behavior of target material in the specific sensing zone relative to the behavior of target material outside the specific sensing zone.

Figure 4B:
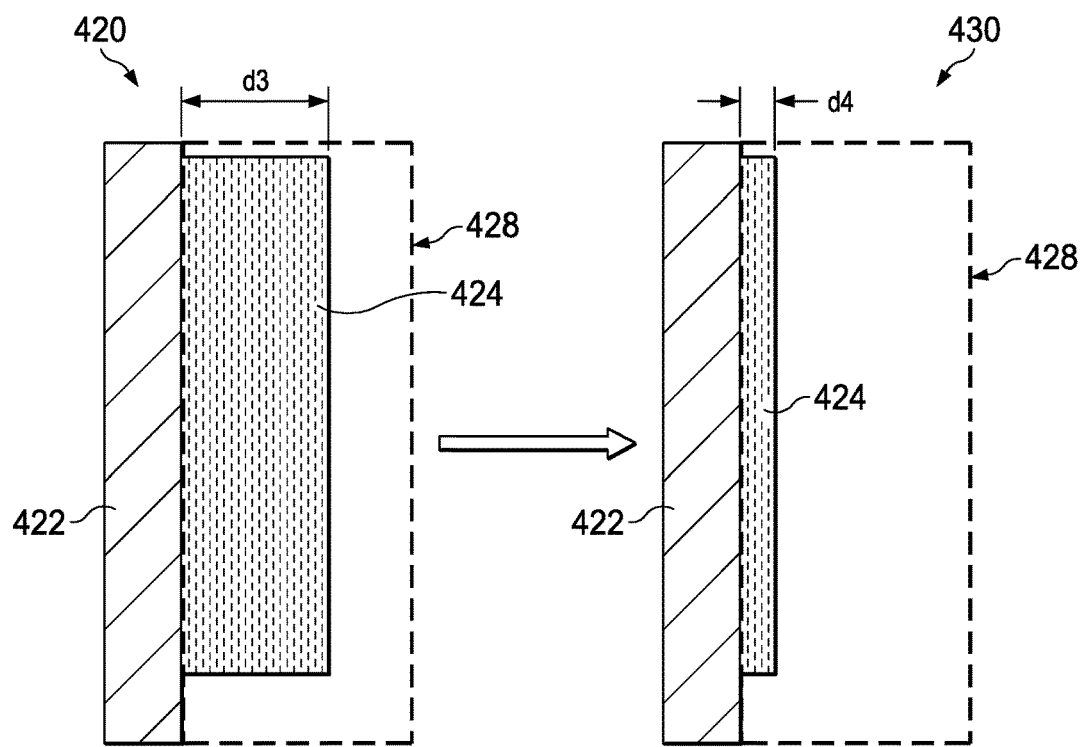

In FIG. 4B, scenario 420 shows a "side" sensing zone 428 relative to a conductive element 422, where a target material 424 in the "side" sensing zone 428 has a thickness d3 (e.g., 4 mm). At a later time represented in scenario 430, the target material 424 has another thickness, d4, that is smaller than d3 (e.g., d4=2 mm in scenario 430). In some examples, target material sensing as described herein is performed to estimate a value for d3 and/or d4. In other examples, target material sensing as described herein is performed to estimate a value for d3−d4 (the amount of reduction in thickness of the target material 424 for scenario 430 relative to scenario 420). In other examples, target material sensing as described herein is performed to estimate a target material volume associated with d3 and/or d4. In other examples, target material sensing as described herein is performed to estimate a target material volume associated with d3−d4 (the amount of reduction in volume of the target material 424 for scenario 430 relative to scenario 420).

Figure 4C:
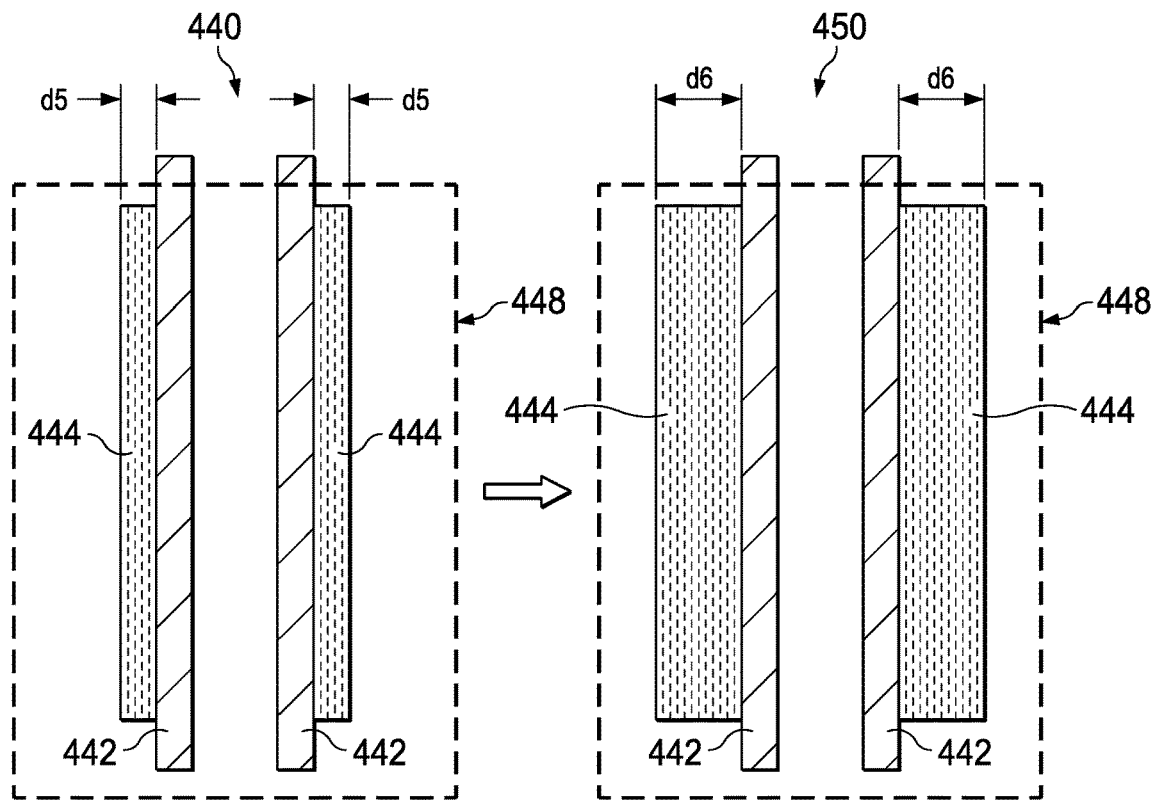

In FIG. 4C, scenario 440 shows a "through" sensing zone 448 relative to a conductive element 442 (e.g., a metallic conduit), where a target material 444 in the "through" sensing zone 448 has a thickness d5 (e.g., 2 mm) around the outside of the conductive element 442. At a later time represented in scenario 450, the target material 444 has another thickness, d6, that is larger than d5 (e.g., d6=4 mm in scenario 450). In some examples, target material sensing as described herein is performed to estimate a value for d5 and/or d6. In other examples, target material sensing as described herein is performed to estimate a value for d6−d5 (the amount of increase in thickness of the target material 444 around the conductive element 442 for scenario 450 relative to scenario 440). In other examples, target material sensing as described herein is performed to estimate a target material volume associated with d5 and/or d6. In other examples, target material sensing as described herein is performed to estimate a target material volume associated with d6−d5 (the amount of increase in volume of the target material 444 for scenario 450 relative to scenario 440). In other examples, though not specifically shown, a "through" sensing zone (e.g., the "through" sensing zone 448) is used to track a reduction in target material thickness or volume as a function of time (similar to FIG. 4B, but with a "through" sensing zone).

Figure 4D:
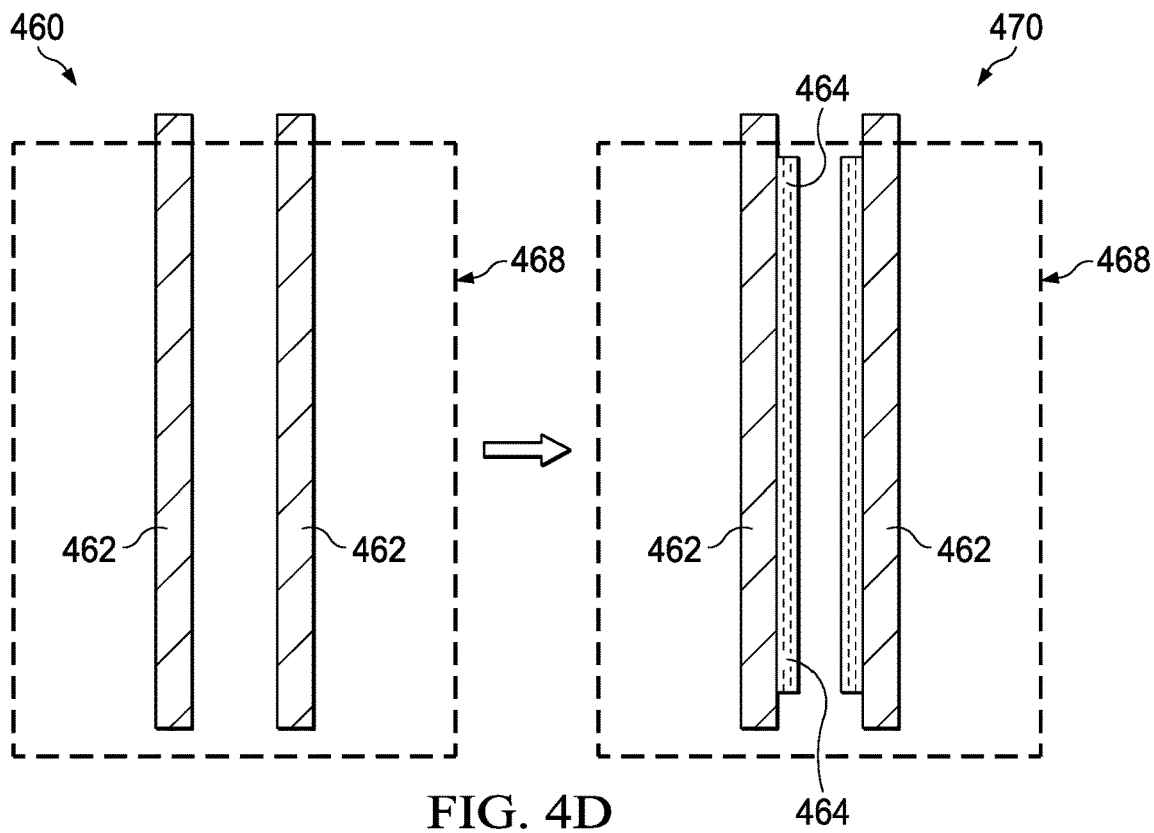

In FIG. 4D, scenario 460 shows a "through" sensing zone 468 relative to a conductive element 462 (e.g., a metallic conduit), where a target material is not present yet inside or outside the conductive element 462. At a later time represented in scenario 470, a target material 464 is present inside the conductive element 462. In some examples, target material sensing as described herein is performed to estimate a thickness of the target material 464 inside the conductive element 462. In other examples, target material sensing as described herein is performed to estimate a change in target material thickness inside the conductive element 462 (an increase or decrease in thickness). In other examples, target material sensing as described herein is performed to estimate a target material volume inside the conductive element 462. In other examples, target material sensing as described herein is performed to estimate a change in target material volume (an increase or decrease) inside the conductive element 462.

Figure 4E:
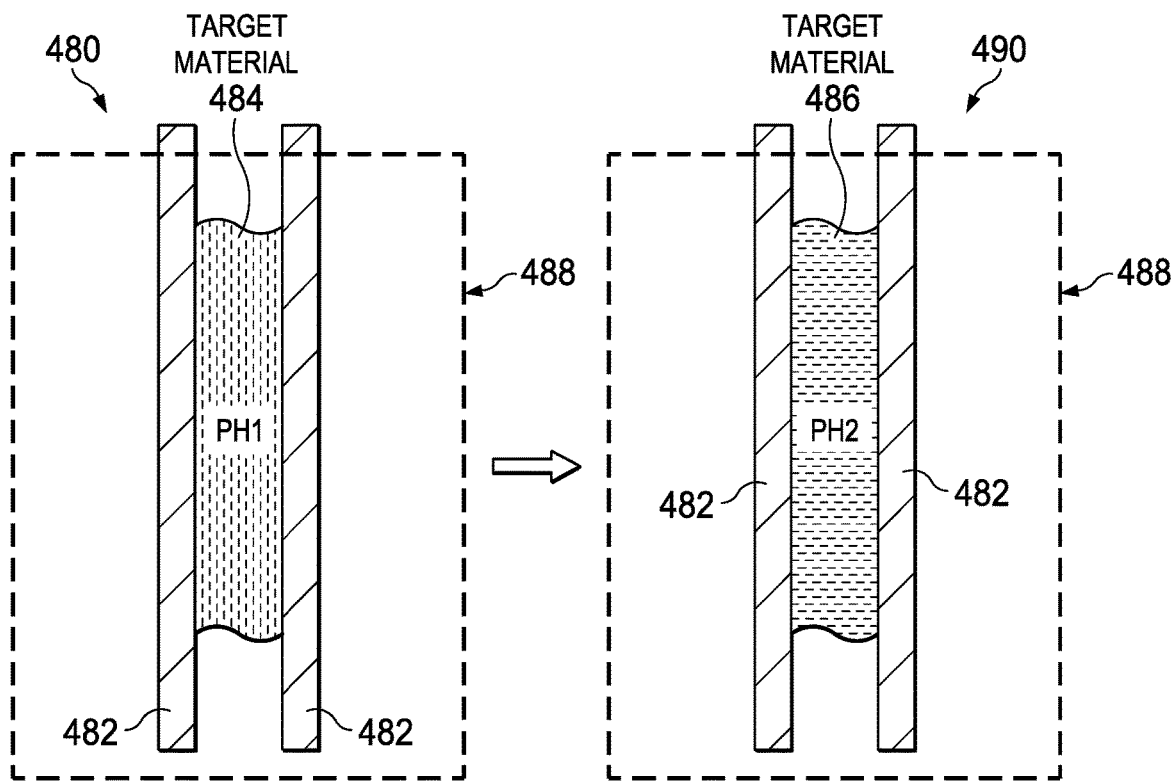

In FIG. 4E, scenario 480 shows a "through" sensing zone 488 relative to a conductive element 482 (e.g., a metallic conduit), where a target material 484 with a first phase (PH1—a gas phase, a liquid phase, or a solid phase) is present inside the conductive element 482. At a later time represented in scenario 490, a target material 486 with a different phase (PH2) relative to PH1 is present inside the conductive element 482. In some examples, target material sensing as described herein is performed to estimate the phase of a target material and/or to track when the phase of a target material changes (e.g., gas to liquid, liquid to gas, liquid to solid, solid to liquid, gas to solid, solid to gas).

Figure 5:
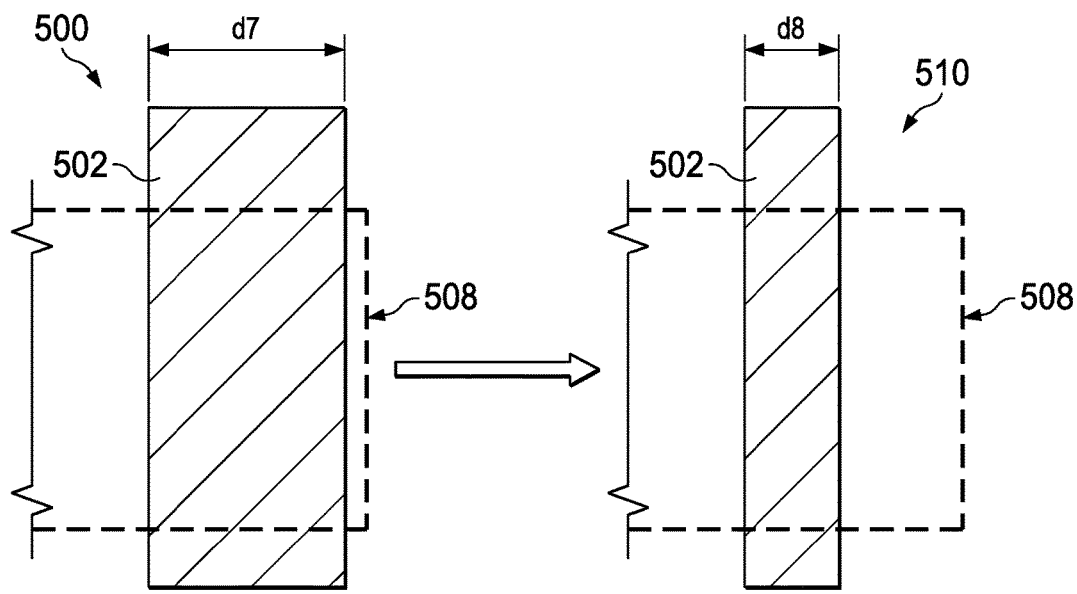
FIG. 5 shows another target material sensing scenario in accordance with various examples.

FIG. 5 shows another target material sensing scenario in accordance with various examples. In FIG. 5, scenario 500 shows a "through" sensing zone 508 relative to a conductive element 502 (e.g., a metallic conduit), where a wall thickness of the conductive element 502 is given as d7 (e.g., d7=3 mm). At a later time represented in scenario 510, the wall thickness of the conductive element 502 is reduced to d8 (e.g., d8=1.5 mm). In some examples, target material sensing as described herein is performed to estimate changes in the wall thickness of a conductive element (e.g., due to corrosion over time).

While the scenarios represented in FIGS. 4C-4E and FIG. 5 are described separately, it should be understood that, in some examples, a "through" sense zone is able to track target material changes inside or outside a conductive element and/or changes to the wall thickness of a conductive element. As needed, the disclosed target material sensing components are combined with other sensing techniques to help distinguish between different materials in a sensing zone (e.g., to distinguish between changes to a conductive element versus changes to mineral deposits inside or outside the conductive element).

Figure 6A:
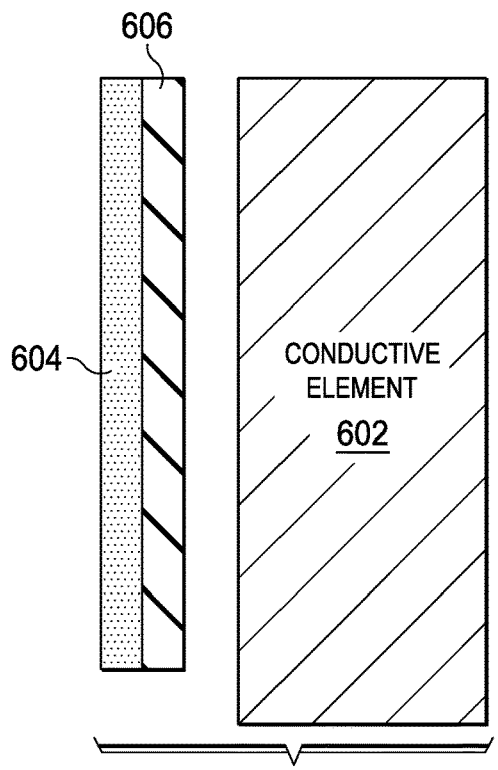
FIGS. 6A-6C show different electrical isolation arrangements in accordance with various examples.
Figure 6B:
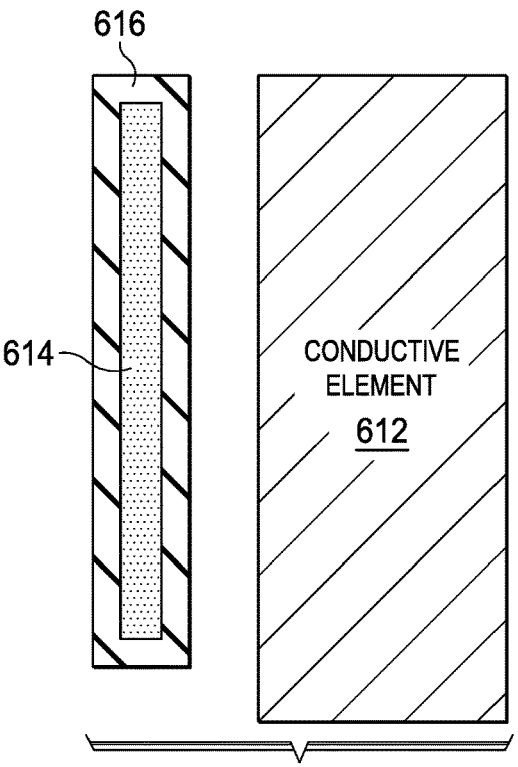
Figure 6C:
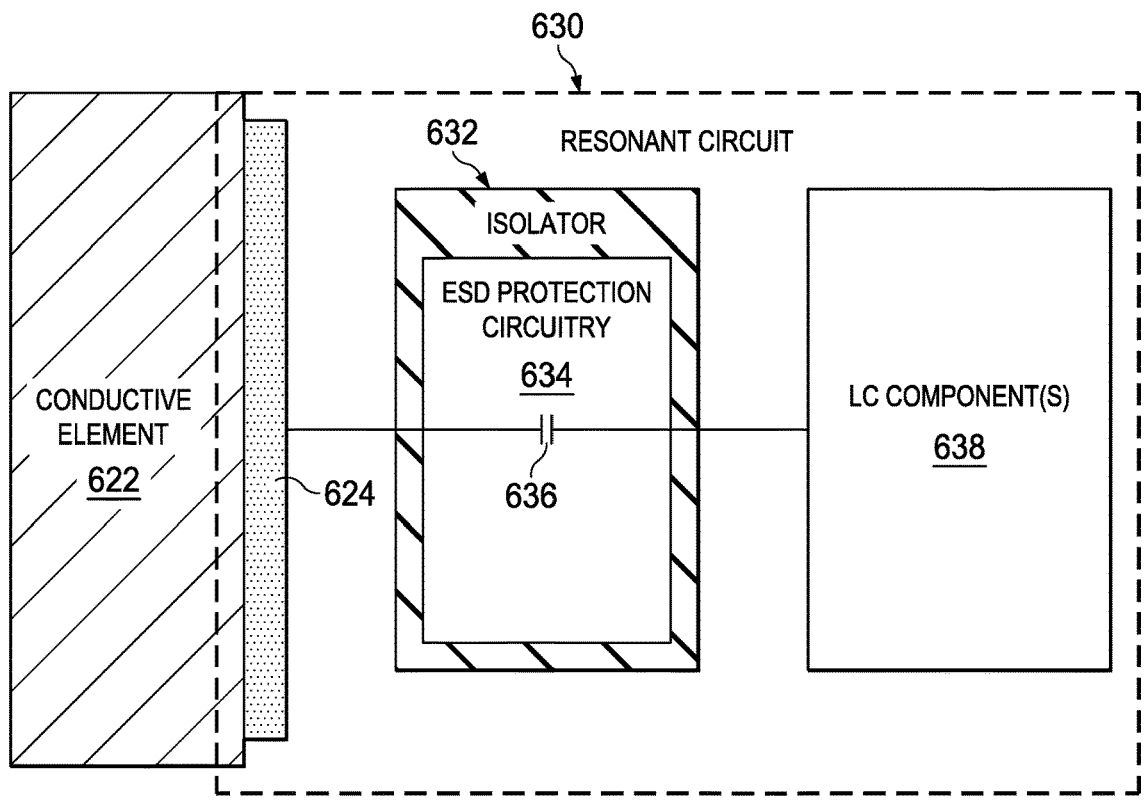

FIGS. 6A-6C show different electrical isolation arrangements in accordance with various examples. In FIG. 6A, a sensing capacitor terminal 604, insulative material 606, and a conductive element 602 are represented. As shown, the insulative material 606 covers the surface of the sensing capacitor terminal 604 that faces the conductive element 602, and thus electrically isolates the conductive element 602 from the sensing capacitor terminal 604 and/or from other target material sensing components. Example materials for the insulative material 606 include glass, porcelain, plastic, rubber, and composite polymers. In various examples, the electrical isolation arrangement of FIG. 6A is used in a "side" sensing zone scenario or a "through" sensing zone scenario to electrically isolate a conductive element (e.g., conductive elements 102, 202, or 602 in FIGS. 1, 2, and 6) from sensitive target material sensing components and/or other components of a system.

In FIG. 6B, a sensing capacitor terminal 614, insulative material 616, and a conductive element 612 are represented. As shown, the insulative material 616 covers all surfaces of the sensing capacitor terminal 614 (a wire connection would still be needed to connect the sensing capacitor terminal 614 to other components of a resonant circuit), and thus electrically isolates the conductive element 612 from the sensing capacitor terminal 614 and/or from other target material sensing components. In some examples, the insulative material 616 is a coating applied to the sensing capacitor terminal 614. Example materials for the insulative material 616 include glass, porcelain, plastic, rubber, and composite polymers. In various examples, the electrical isolation arrangement of FIG. 6B is used in a "side" sensing zone scenario or a "through" sensing zone scenario to electrically isolate a conductive element (e.g., conductive elements 102, 202, or 602 in FIGS. 1, 2, and 6) from sensitive target material sensing components and/or other components of a system.

In FIG. 6C, a conductive element 622 and a sensing capacitor terminal 624 are represented, where the sensing capacitor terminal 624 is part of a resonant circuit 630. In the electrical isolation arrangement of FIG. 6C, an isolator 632 between the sensing capacitor terminal 624 and LC component(s) 638 of the resonant circuit 630 includes electrostatic discharge (ESD) protection circuitry 634 such as a safety capacitor 636. In some examples, the electrical isolation arrangements of FIGS. 6A and 6C are combined. Alternatively, the electrical isolation arrangements of FIGS. 6B and 6C are combined.

Figure 7:
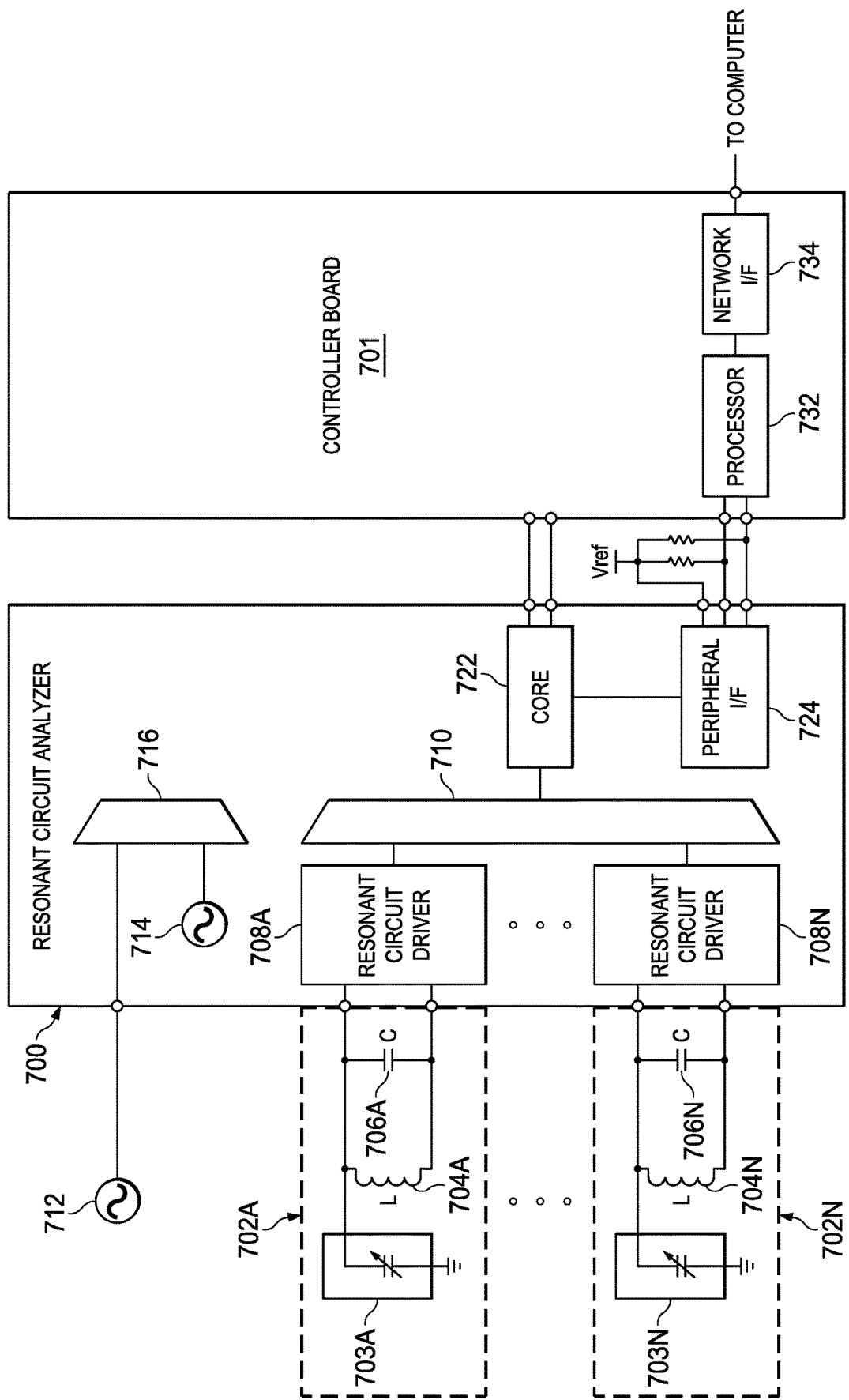
FIG. 7 shows a schematic diagram of target material sensing components for a system in accordance with various examples.

FIG. 7 shows a schematic diagram of target material sensing components for a system in accordance with various examples. In FIG. 7, the target material sensing components represented include resonant circuits 702A-702N, each with a separate sensing capacitor 703A-703N (each shown as a variable capacitor). Each resonant circuit also includes a respective inductor 704A-704N, and a respective capacitor 706A-706N. In some examples, each of the resonant circuits 702A-702N represented in FIG. 7 is an example of the resonant circuits 110 or 210 represented in FIGS. 1 and 2. Similarly, each of the sensing capacitors 703A-703N represented in FIG. 7 is an example of the sensing capacitors 103 or 203 represented in FIGS. 1 and 2. Also, each of the inductors 704A-704N and/or capacitors 706A-706N represented in FIG. 7 is an example of the LC component(s) 112 or 212 represented in FIGS. 1 and 2.

In various examples, target material sensing is performed using a resonant circuit analyzer 700 (an example of resonant circuit analyzer 114 or 214 in FIGS. 1 and 2) and a processor 732 (an example of processor 116 or 216 in FIGS. 1 and 2). The resonant circuit analyzer 700, for example, selects one of resonant circuits 702A-702N and uses a respective resonant circuit driver 708A-708N to energize the selected resonant circuit. In some examples, a resonant circuit is energized using a range of frequencies to find its resonant frequency. The resonant circuit analyzer 700 also samples the resonant frequency of the selected (and energized) resonant circuit. In one example, sampling components are included with each resonant circuit driver 708A. In other examples, at least some driver components and/or sampling components are shared by the resonant circuit drivers 708A-708N. In addition, in some examples, resonant frequency sampling is performed for a plurality of the resonant circuits 702A-702N at the same time. In other examples, resonant frequency sampling is performed for only one of the resonant circuits 702A-702N at a time. In such case, resonant frequency sampling operations are controlled based on a schedule and/or signaling scheme. As needed, resonant frequency samples are buffered and/or stored for later analysis.

Determining the resonant frequency variance for a resonant circuit due to the variance of a sensing capacitor in a resonant circuit is possible when the other variables of the resonant circuit are known. Thus, in one example, the capacitance for each capacitor 706A-706N and each inductor 704A-706N is known. Also, the frequency used to energize a resonant circuit is known. Accordingly, in one example, the capacitance of a sensing capacitor is determined from the equation for resonant frequency:

$$F = \frac{1}{2\pi\sqrt{LC}} \qquad \text{EQ 1}$$

where F is the resonant frequency of a selected resonant circuit, L is the inductance value of the selected resonant circuit, and C is the aggregate capacitance of the sensing capacitor and any other capacitor in the selected resonant circuit. In some examples, Equation 1 is transformed to find the capacitance of a sensing capacitor as:

$$C_{sense} = \frac{\left(\frac{1}{2\pi F}\right)^2}{L} - C_{other} \qquad \text{EQ 2}$$

where F is the resonant frequency, L is the inductance value in the selected resonant circuit, $C_{sense}$ is the capacitance value of the sensing capacitor for the selected resonant circuit, and $C_{other}$ is the capacitance value of other capacitors in the selected resonant circuit.

In some examples, resonant frequency sampling and/or other operations of the resonant circuit analyzer 700 are performed at a rate determined by an input clock 712 or an internal oscillator 714 (e.g., a multiplexer 716 selects one of the available oscillation rates). As shown, a multiplexer 710 connects the output of each resonant circuit driver 708A-708N to a core 722 of the resonant circuit analyzer 720. In operation, the core 722 receives resonant frequency samples for a selected resonant circuit and determines a resonant frequency and/or other parameters (e.g., a change in resonant frequency, a capacitance for a respective sensing capacitor, or a change in capacitance for a respective sensing capacitor). The core 722 provides digitized analyzer signals (e.g., representing a resonant frequency, a change in resonant frequency, a capacitance for a respective sensing capacitor, or a change in capacitance for a respective sensing capacitor) to a peripheral interface 724 (e.g., an I2C interface) in communication with a processor 732. The processor 732 uses the digitized analyzer signals received from the resonant circuit analyzer 720 to determine a target material estimate as described herein. As shown, a network interface 734 (e.g., a Micro USB interface) couples to the processor 732 to convey data and/or signals from the processor 732 (e.g., target material estimates and/or signals derived from target material estimates) to an output device (not shown). In examples, the core 722 and/or the processor 732 is a microcontroller integrated circuit, a microprocessor integrated circuit, a field programmable gate array (FPGA) integrated circuit, a complex programmable logic device (CPLD) integrated circuit, or an application specific integrated circuit (ASIC) integrated circuit.

In the example of FIG. 7, various target material sensing components discussed correspond to integrated circuit components and/or printed circuit board (PCB) components. In one example, all of the components represented in FIG. 7, except for the sensing capacitors 703A-703N, are integrated circuit components and/or PCB components. More specifically, in one example, the components of the resonant circuit analyzer 700 correspond to integrated circuit components (on one or more chips). Meanwhile, the processor 732 and network interface 734 are PCB components that are part of a controller board 701 that represents a PCB or part of a PCB. The various PCB components (e.g., the network adapter 734 and the inductors 704A-704N) are coupled to integrated circuits components as needed via PCB traces/pads. The capacitors 706A-706N represent capacitor components and/or stray capacitances between PCB traces and/or PCB components. In some examples, PCB components also provide signals and/or voltage supplies used by integrated circuit components. For example, a reference voltage (Vref) in FIG. 7 is supplied to the resonant circuit analyzer 700 and to the processor 732 via one or more resistors.

Figure 8:
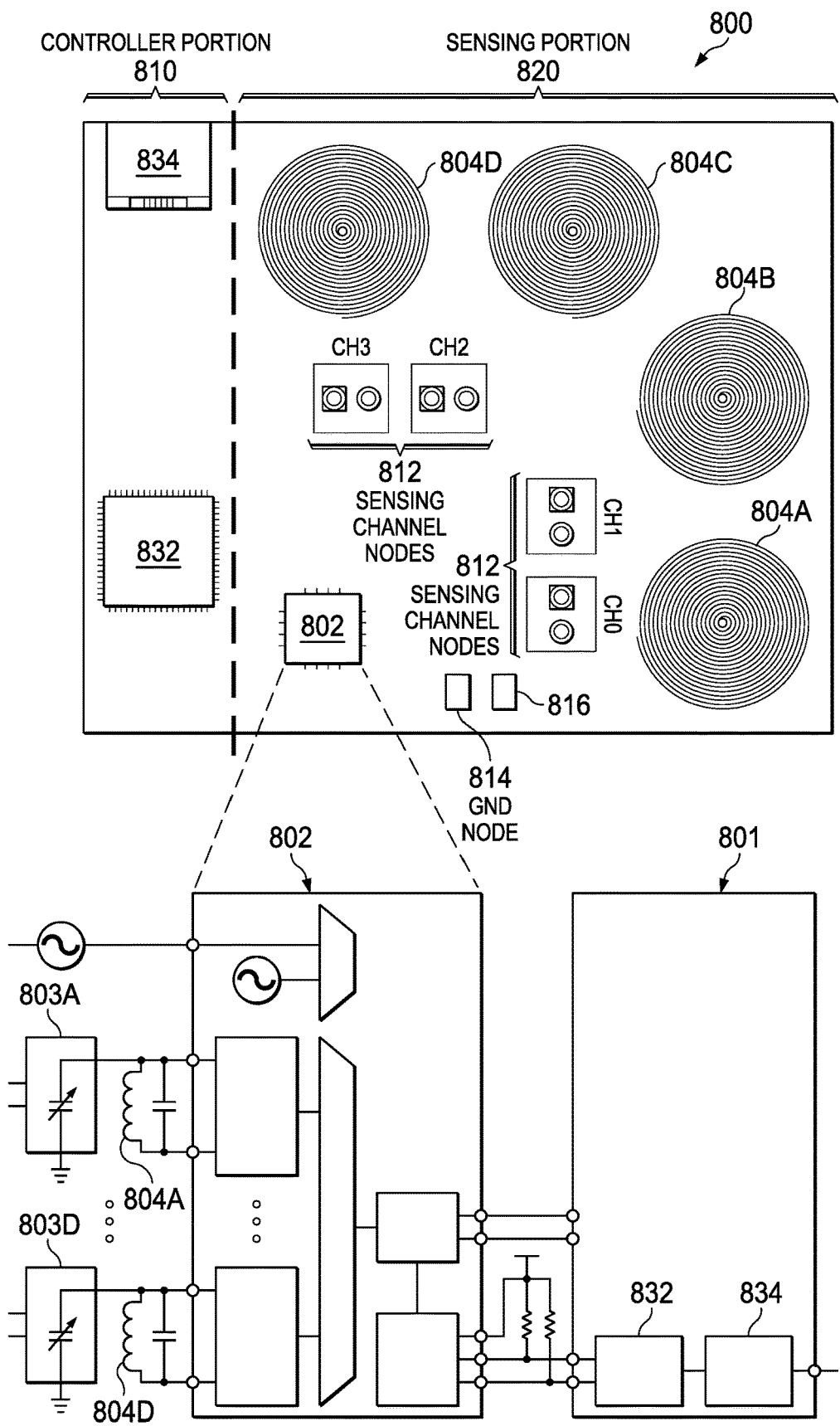
FIG. 8 shows a printed circuit board (PCB) with target material sensing components in accordance with various examples.

FIG. 8 shows a PCB 800 with target material sensing components in accordance with various examples. As shown in FIG. 8, the PCB 800 comprises a controller portion 810 that includes a processor 832 (an example of processors 116, 216, or 732 in FIGS. 1, 2, and 7) and a network interface 834 (an example of network interface 734 in FIG. 7). The PCB 800 also comprises a sensing portion 820 that includes a resonant circuit analyzer 802 (an example of resonant circuit analyzer 114, 214, or 700 in FIGS. 1, 2, and 7). The sensing portion of the PCB 800 supports up to four sensing channels (CH0-CH3), each coupled to a respective inductor coil 804A-804D integrated with the PCB 800 (e.g., as planar spiral inductors). For each of the sensing channels CH0-CH3, there are respective sensing channel nodes 812 for completing a resonant circuit that includes at least one of the inductor coils 804A-804D and an external sensing capacitor 803A-803D (an example of sensing capacitors 103, 203, or 703A-703N in FIGS. 1, 2, and 7). The PCB 800 also includes at least one ground (GND) node 814. In various examples, one terminal for each sensing capacitor couples to a GND node 814 of the PCB 800. Also, in some examples, the PCB 800 includes at least one electrostatic discharge protection component 816 (an example of isolator(s) 120 or 220 in FIGS. 1 and 2) between the GND node 814 and at least one other component. An example of the electrostatic discharge protection component 816 is a safety capacitor. In examples, the PCB 800 is able to provide a capacitance resolution for each sensing capacitor 803A-803D of 200 femtofarads or less, 100 femtofarads or less, 50 femtofarads or less, or 10 femtofarads or less.

Figure 9B:
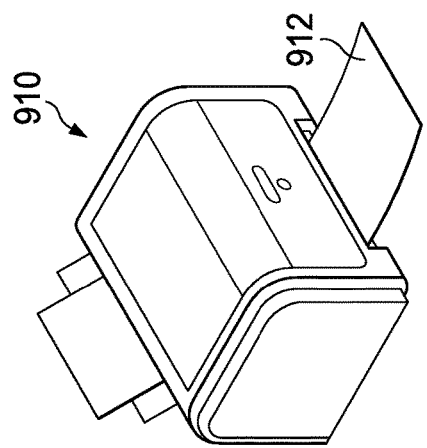
FIGS. 9A-9C shows different output devices for target material sensing scenarios in accordance with various examples.
Figure 9A:
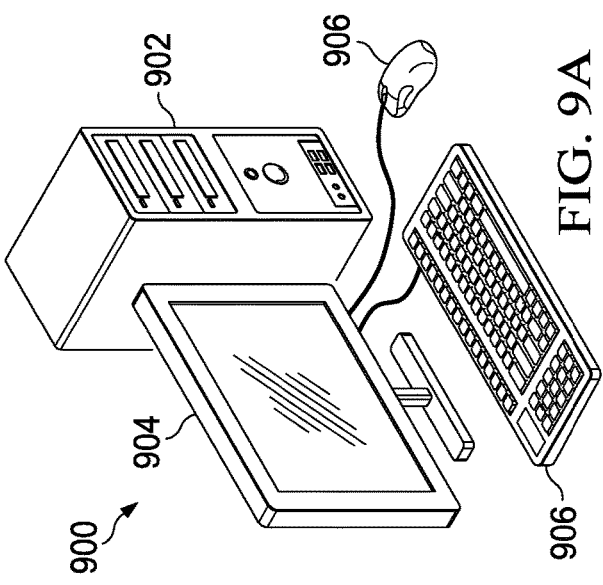
Figure 9C:
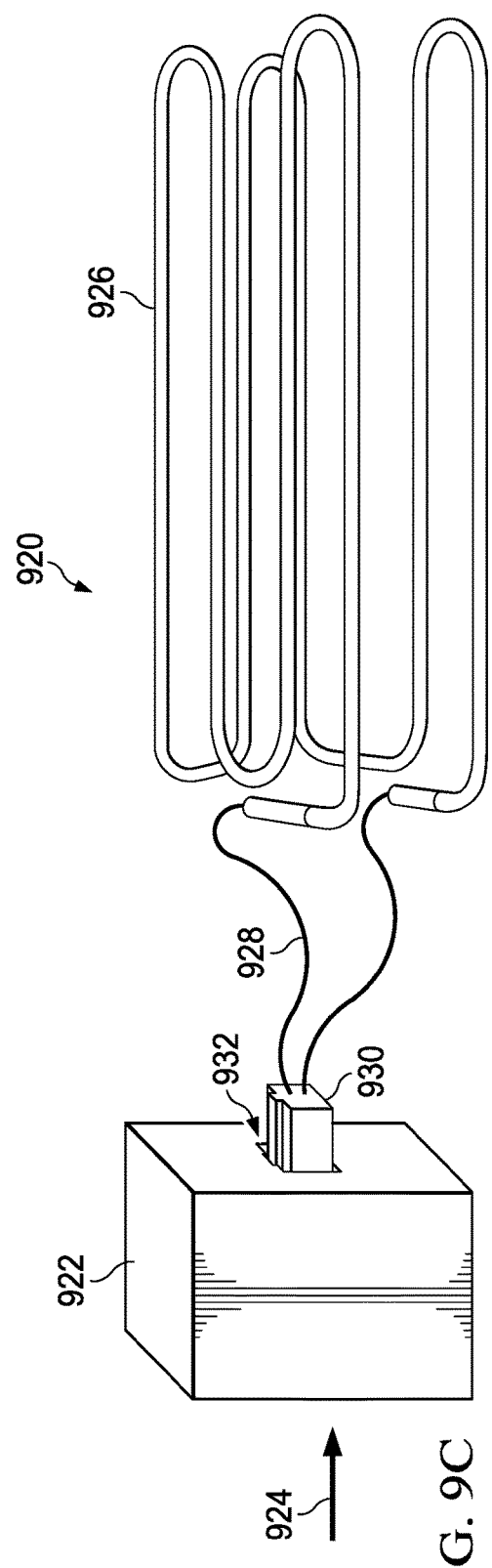

FIGS. 9A-9C shows different output devices for target material sensing scenarios in accordance with various examples. In FIG. 9A, a computer 900 (an example of the output device 118 or 218 in FIGS. 1 and 2) with a processor 902, a display 904, and input devices 906 (e.g., a keyboard and mouse) is represented. In some examples, the computer 900 includes a speaker and/or other devices to present audio or visual information. In an example target material sensing scenario, the computer 900 receives target material estimates and/or signals derived from target material estimates. The computer 900, for example, presents target material estimates (e.g., a thickness value, a change in thickness value, a volume value, a change in volume value, a log of thickness and/or volume values, a phase, a log of phases) on the display 904. Additionally or alternatively, the computer 900 presents alert messages on the display 904 in response to received target material estimates or signals derived from target material estimates. An example alert message includes sufficient information to facilitate a response (e.g., sensing zone information, an urgency rating, response options, etc.). While the computer 900 represented in FIG. 9A has the form of a desktop computer, it should be understood that other computer forms are possible (e.g., a laptop computer, a tablet computers, a smart phone, etc.).

In FIG. 9B, a printer 910 (an example of the output device 118 or 218 in FIGS. 1 and 2) is represented. In an example target material sensing scenario, the printer 910 receives target material estimates and/or signals derived from target material estimates. The printer 910, for example, presents target material estimates (e.g., a thickness value, a change in thickness value, a volume value, a change in volume value, a log of thickness and/or volume values, a phase, a log of phases) on printed paper 912. Additionally or alternatively, the printer 910 presents printed alert messages in response to received target material estimates or signals derived from target material estimates. An example alert message includes sufficient information to facilitate a response (e.g., sensing zone information, an urgency rating, response options, etc.).

In FIG. 9C, a defrost unit 920 (an example of the output device 118 or 218 in FIGS. 1 and 2) is represented. In an example target material sensing scenario, the defrost unit 920 receives target material estimates and/or signals derived from target material estimates and responds accordingly. In one example, the defrost unit 920 includes a controller 922 and a heating element 926 coupled to the controller 922 via a cable 928, a plug 930, and a port 932. In operation, the controller 922 receives a control signal 924 from a processor (e.g., one of the processors 116, 216, 732, or 832 in FIGS. 1, 2, 7, and 8) as described herein and responds. More specifically, if the control signal 924 is a start control signal, the controller 922 provides current to the heating element 926 (e.g., a switch is closed). On the other hand, if the control signal 924 is a stop control signal, the controller 922 stops providing current to the heating element 926 (e.g., a switch is opened).

Figure 10:
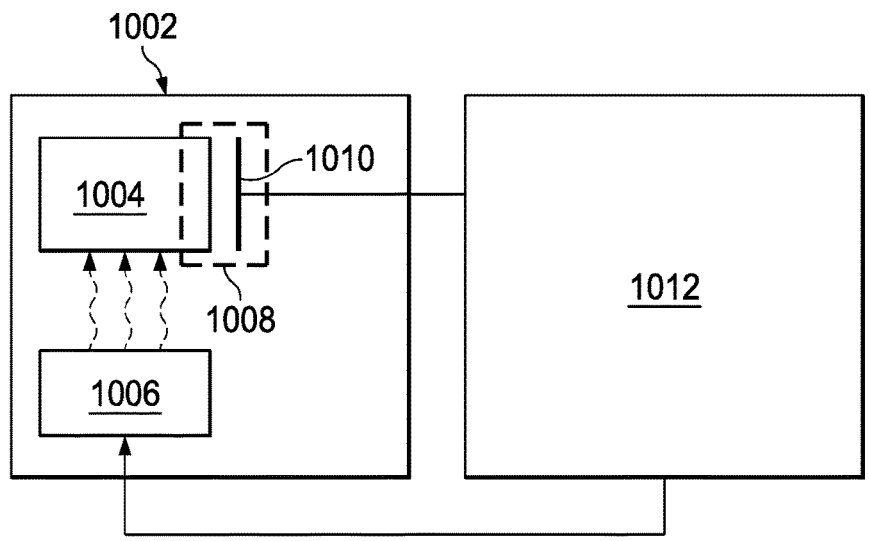
FIG. 10 shows a block diagram of a refrigeration unit with target material sensing components in accordance with various examples.

FIG. 10 shows a block diagram of a refrigeration unit 1002 with target material sensing components 1012 in accordance with various examples. In at least some examples, the refrigeration unit 1002 comprises a metal heat exchanger 1004 and a defrost unit 1006 (an example of the defrost unit 920 in FIG. 9C). Also, in some examples, the metal heat exchanger 1004 has metal surfaces but comprises other components that are not metal. Without limitation, the refrigeration unit 1002 of FIG. 10 corresponds to a refrigerator, a freezer, or an air conditioner. When turned on, the defrost unit 1006 melts frost and ice (frozen water) that accumulated on the surfaces of the metal heat exchanger 1004. A sensing capacitor 1008 (an example of sensing capacitor 103, 203, 703A-703N, 803A-803D in FIGS. 1, 2, 7, and 8) is formed by one or more surfaces of the metal heat exchanger 1004 and a sensing capacitor terminal 1010. The sensing capacitor terminal 1010 takes a variety of forms. In some examples, the sensing capacitor terminal 1010 is located in close proximity to the surface of the metal heat exchanger 1004. In some examples, the sensing capacitor terminal 1010 is planar in form. In some examples, the sensing capacitor terminal 1010 is sleeve-like in form.

The target material sensing components 1012 correspond to resonant circuit components, a resonant circuit analyzer, and/or a processor as described previously (see e.g., FIGS. 1, 2, 7, and 8). In examples, the target material sensing components 1012 result in control signals to turn on and/or turn off the defrost unit 1006 when a criteria or rule is satisfied. In one example, the target material sensing components 1012 provide a target material estimate or control signal to turn on the defrost unit 1006 when a target material estimate exceeds a predetermined threshold. In some examples, the defrost unit 1006 stays on for a defined time interval. In other examples, the target material sensing components 1012 provide additional target material estimates or control signals to turn off the defrost unit 1006 when a target material estimate is below a predetermined threshold. In other examples, resonant frequency parameters (e.g., detecting a minimum or maximum resonant frequency) are used to trigger turning the defrost unit 1006 on or off.

Figure 11:
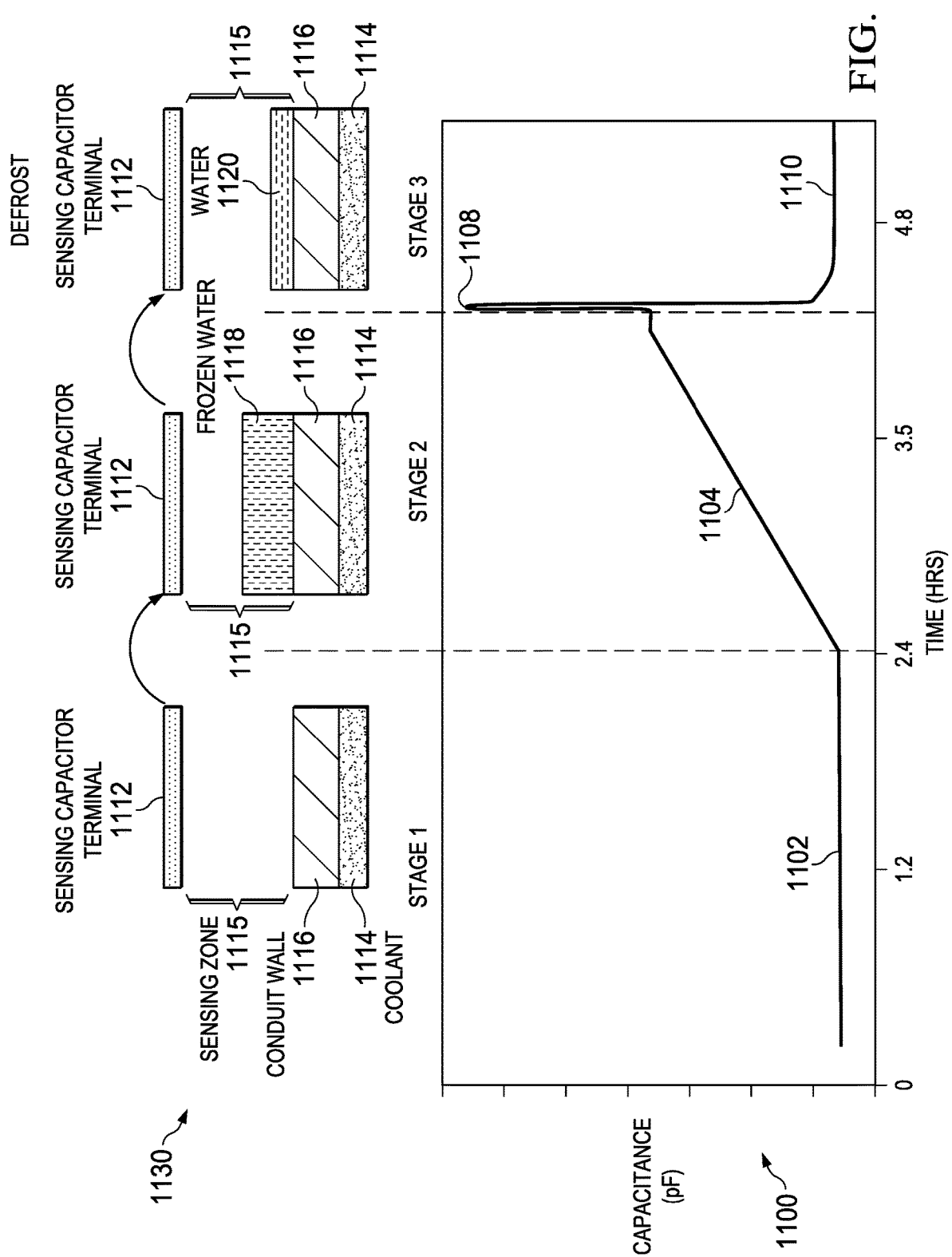
FIG. 11 shows a graph and a target material sensing scenario as a function of time in accordance with various examples.

FIG. 11 shows a graph 1100 and a target material sensing scenario 1130 as a function of time in accordance with various examples. In FIG. 11, three stages (stage 1, stage 2, and stage 3) are represented for the target material sensing scenario 1130, where sensing frozen water in a sensing zone 1115 (an example of sensing zone 108 or 208 in FIGS. 1 and 2) between a conduit wall 1116 and a sensing capacitor terminal 1112 (an example of sensing capacitor terminal 104 or 204 in FIGS. 1 and 2) is performed. In some examples, the conduit wall 1116 is associated with a conduit that conveys a coolant 1114.

In stage 1, there is no frozen water in the sensing zone 1115, and a default capacitance 1102 of a sensing capacitor associated with the represented sensing capacitor terminal 1112 remains stable. In stage 2, the amount of frozen water 1118 in the sensing zone 1115 increases as a function of time (e.g., displacing air in the sensing zone 1115), and results in a corresponding rising capacitance 1104 (a positive slope) for a sensing capacitor associated with the represented sensing capacitor terminal 1112. In stage 3, a defrost unit (not shown) is activated and the frozen water 1118 that accumulated during stage 2 melts, resulting in a capacitance peak 1108 (due to variance between the dielectric constants for frozen water versus liquid water) for the capacitance of the sensing capacitor associated with the represented sensing capacitor terminal 1112. Once the water 1120 leaves the sensing zone 1115, the capacitance of the sensing capacitor associated with the represented sensing capacitor terminal 1112 corresponds to a post-defrost capacitance 1110 (approximately equal to the default capacitance 1102 in this example).

Figure 12:
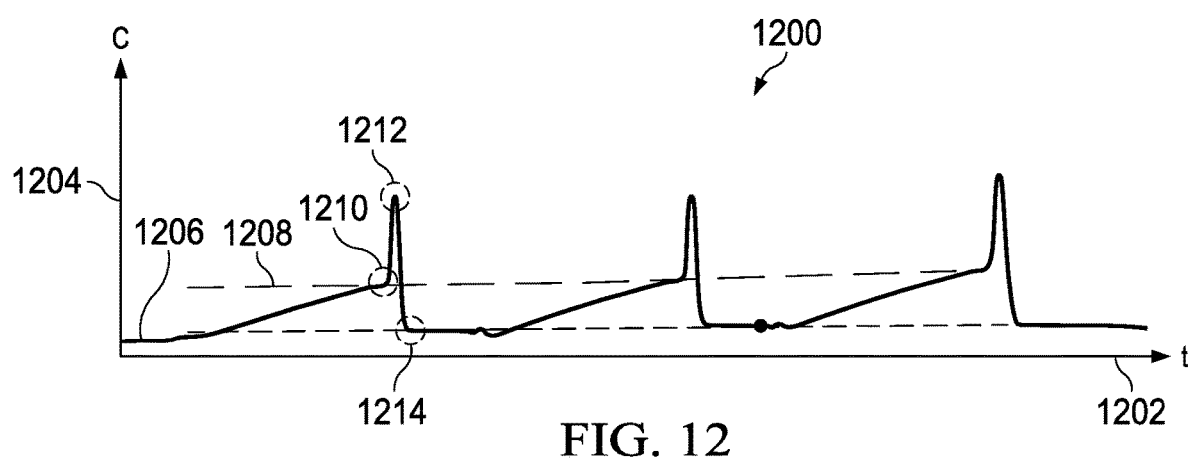
FIG. 12 shows another graph of target material sensing as a function of time in accordance with various examples.

FIG. 12 shows another graph 1200 of target material sensing as a function of time in accordance with various examples. In graph 1200, the capacitance for a sensing capacitor as a function of time is represented. The graph 1200 has an X-axis 1202 or independent variable axis that corresponds to time and a Y-axis 1204 or dependent variable axis that corresponds to capacitance. Over time frozen water accumulates on a metal heat exchanger (e.g., the metal heat exchanger 1004 of FIG. 10), which causes the capacitance for a sensing capacitor (e.g., sensing capacitor 103 or 203 in FIGS. 1 and 2) to increase due to the increased dielectric constant associated with accumulated frozen water in a sensing zone (e.g., sensing zone 108 or 208 of FIGS. 1 and 2). The sensed capacitance over time is shown as trace 1206. At a predefined threshold capacitance 1210, a defrost unit (e.g., defrost unit 1006) is directed to turn on, the frozen water melts, and the capacitance increases to a peak value 1212 due to conversion of frozen water to water (water has a much higher dielectric constant than frost and ice). As heating continues, the capacitance decreases rapidly towards a default capacitance 1214 as water drains away from the sensing zone. In some examples, the default capacitance 1214 corresponds to a sensing zone that is free of water and/or frozen water.

In some examples, the default level 1214 of the capacitance of a sensing capacitor (e.g., sensing capacitors 103 or 203 in FIGS. 1 and 2) varies slowly over time, for example over months or years. This variance occurs, for example, due to oxidation on a surface of the sensing capacitor terminals. Such variance can be accounted for by changing resonant frequency or capacitance thresholds used to turn on or turn off a defrost unit.

Figure 13A:
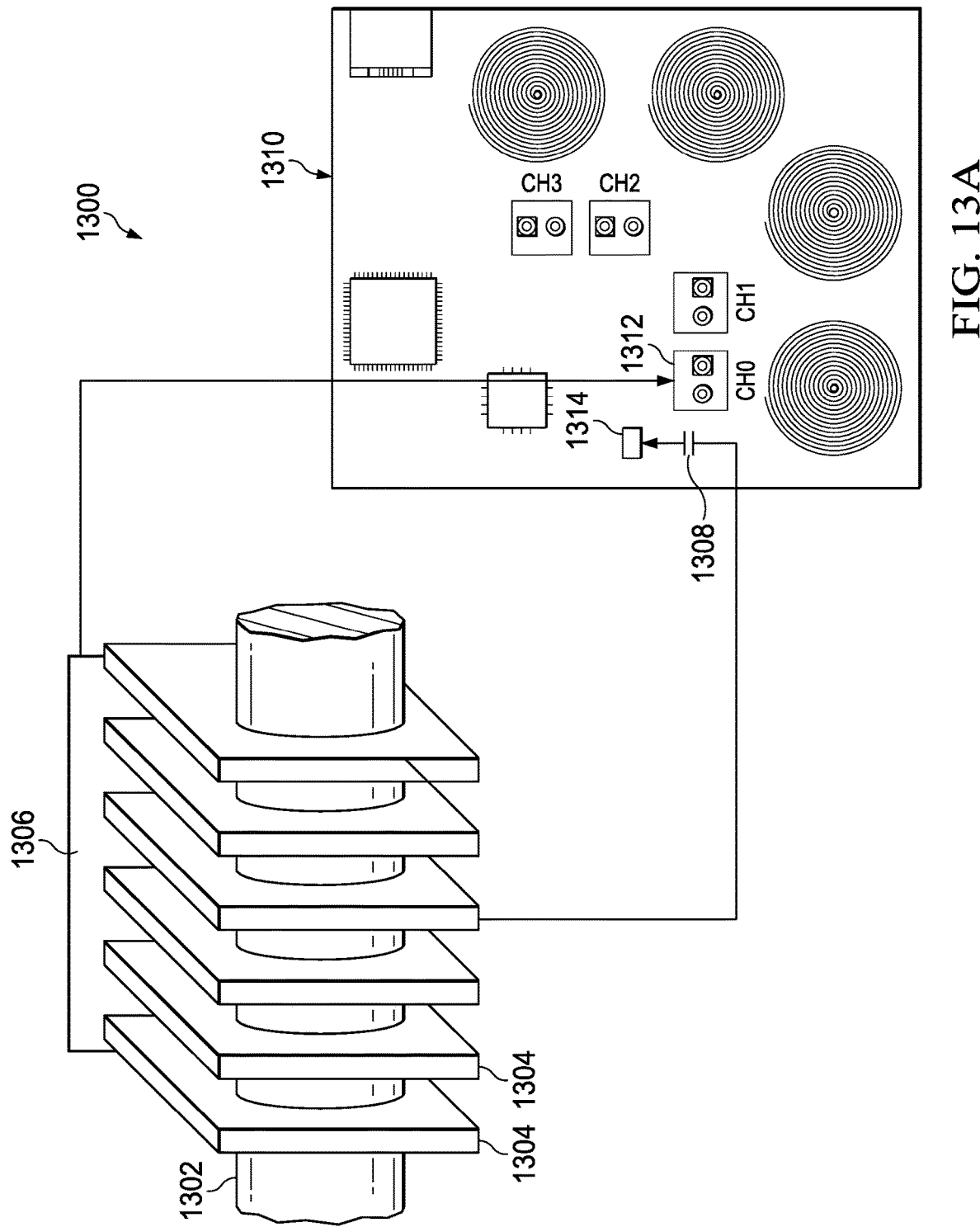
FIGS. 13A and 13B show target material sensing arrangements in accordance with various examples.
Figure 13B:
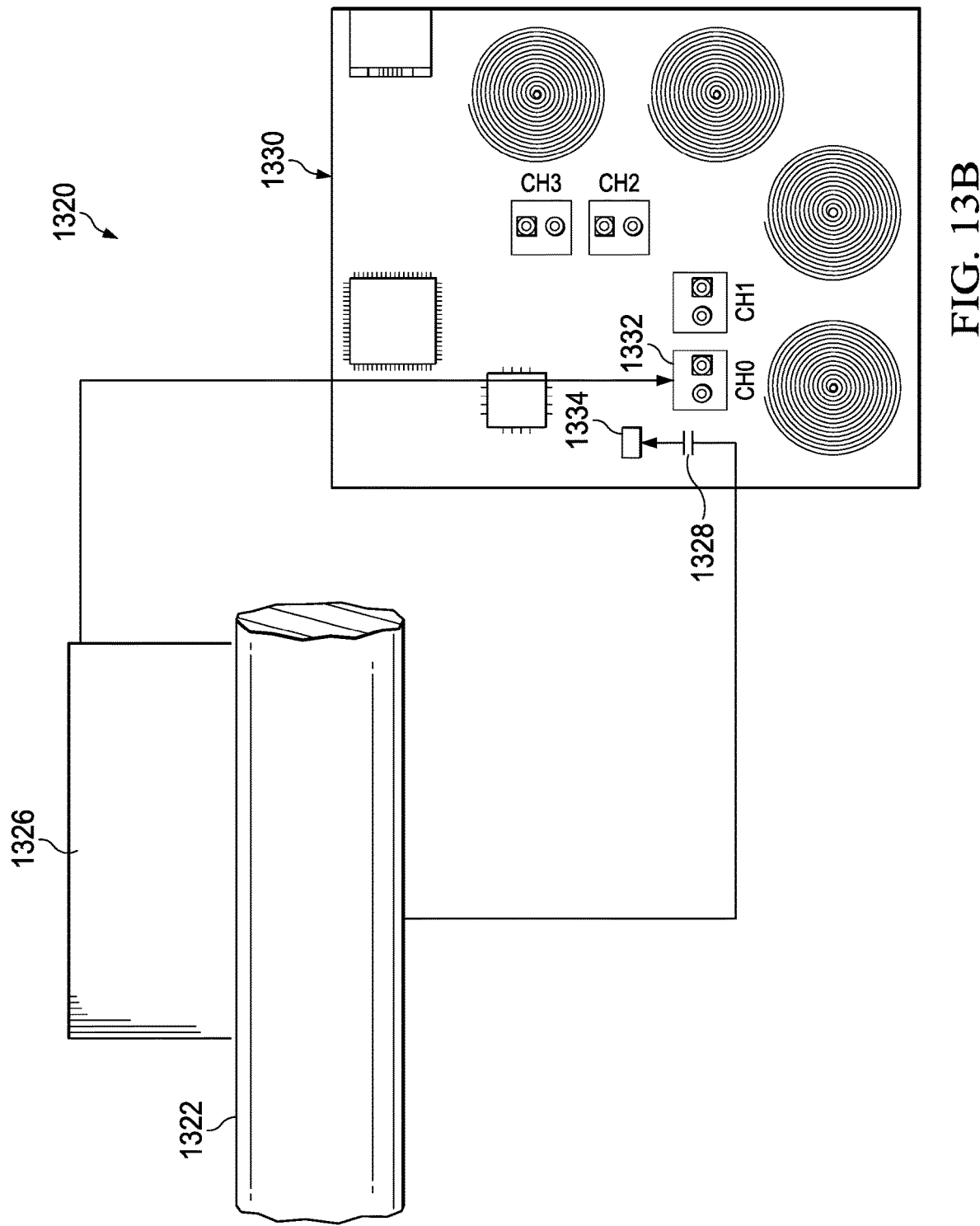

FIGS. 13A and 13B show target material sensing arrangements 1300 and 1320 in accordance with various examples. In FIG. 13A, the target material sensing arrangement 1300 includes a sensing capacitor terminal 1306, a metal heat exchanger 1302 with metal fins 1304, a safety capacitor 1308, and a PCB 1310 (an example of PCB 800 in FIG. 8). In the target material sensing arrangement 1300, the metal heat exchanger 1302 functions as one of the terminals of a sensing capacitor. More specifically, the sensing capacitor terminal 1306 couples to a sensing channel node 1312 of the PCB 1310 and the metal heat exchanger 1302 couples to a GND node 1314 of the PCB 1310 via the safety capacitor 1308.

In FIG. 13B, the target material sensing arrangement 1320 includes a sensing capacitor terminal 1326, a metallic conduit 1322, a safety capacitor 1328, and a PCB 1330 (an example of PCB 800 in FIG. 8). In the target material sensing arrangement 1320, the metallic conduit 1322 functions as one of the terminals of a sensing capacitor. More specifically, the sensing capacitor terminal 1326 couples to a sensing channel node 1332 of the PCB 1330 and the metallic conduit 1322 couples to a GND node 1334 of the PCB 1330 via the safety capacitor 1328.

Figure 14A:
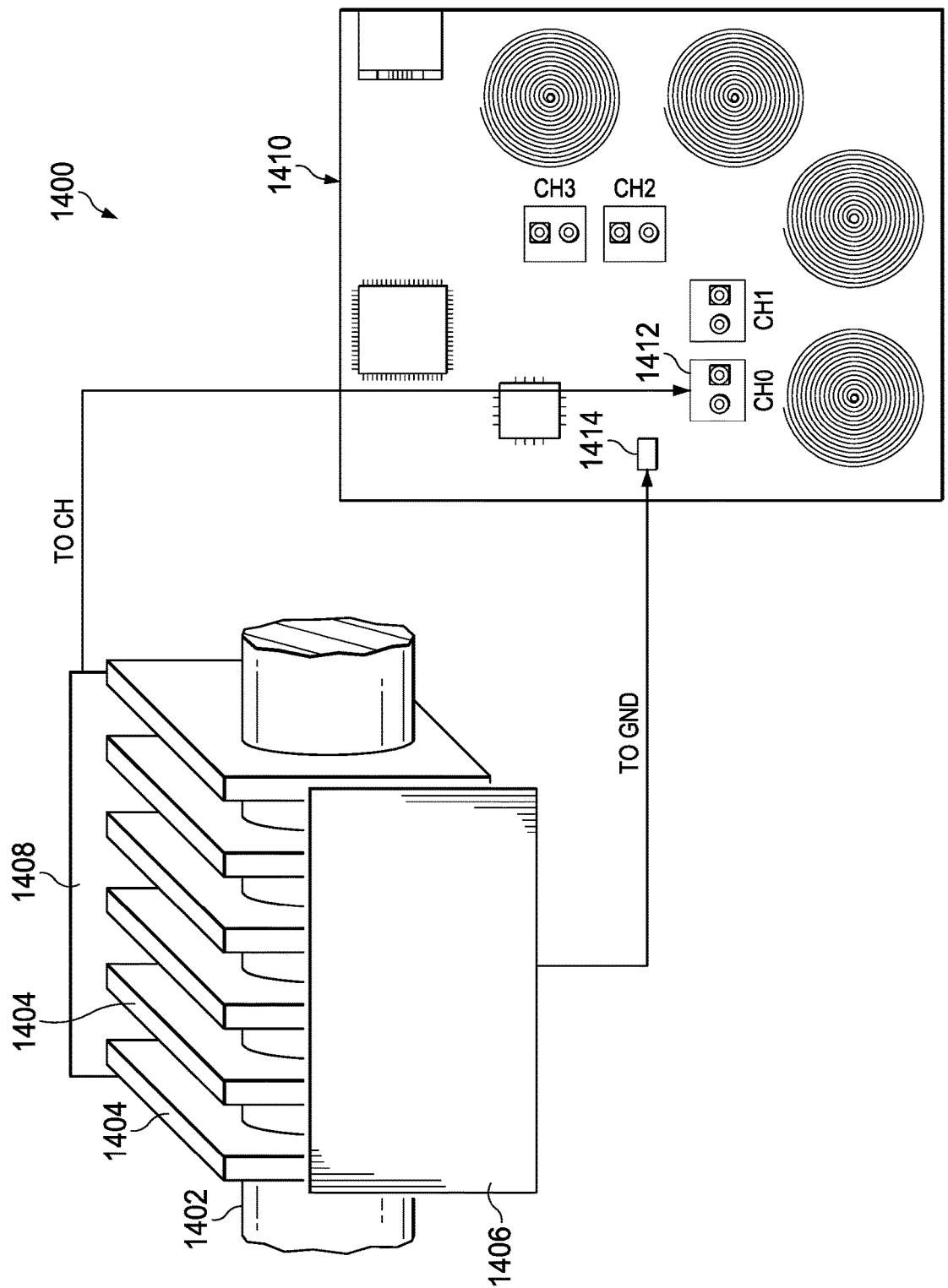
FIGS. 14A and 14B show additional target material sensing arrangements in accordance with various examples.
Figure 14B:
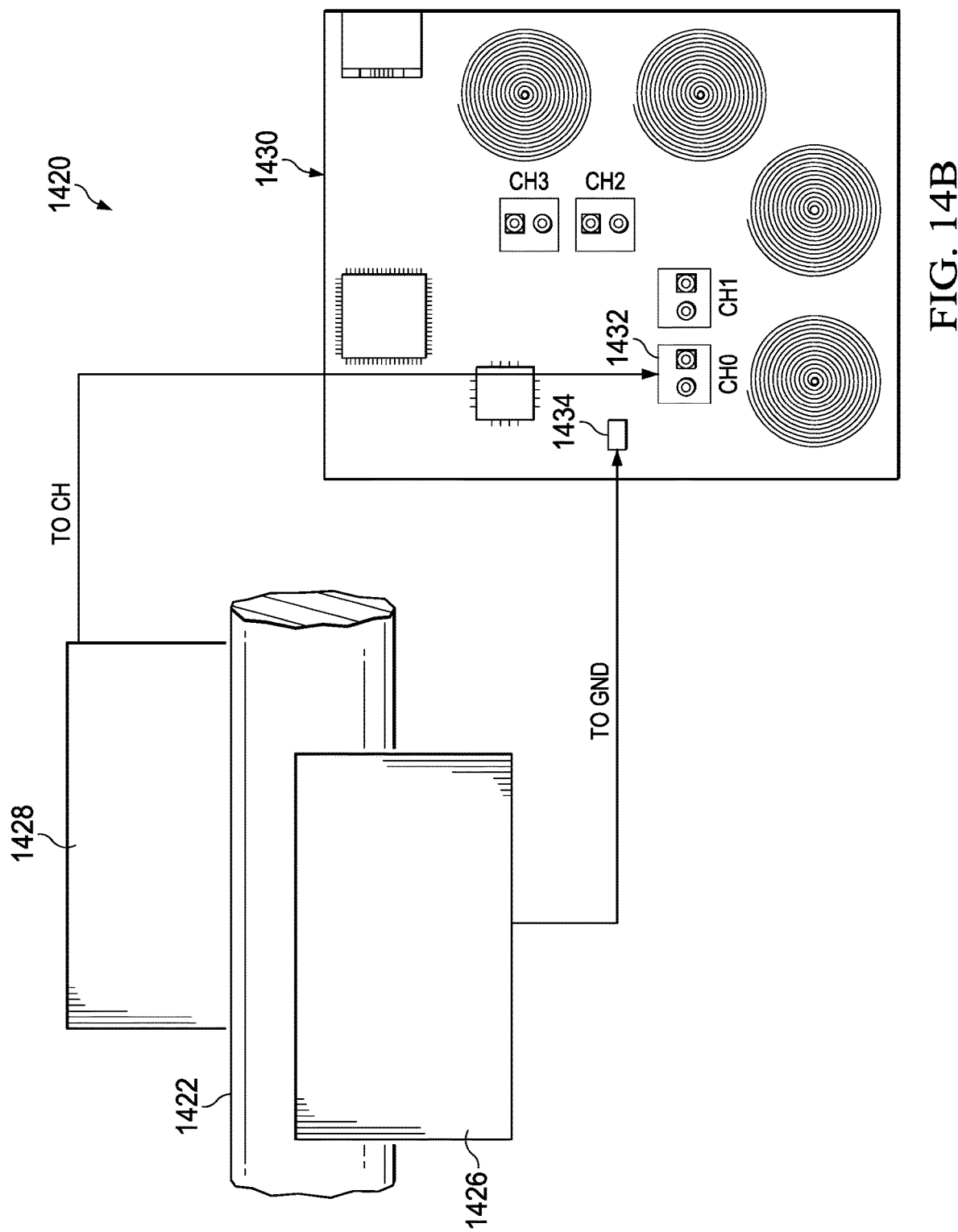

FIGS. 14A and 14B show additional target material sensing arrangements in accordance with various examples. In FIG. 14A, the target material sensing arrangement 1400 includes sensing capacitor terminals 1406 and 1408, a metal heat exchanger 1402 with metal fins 1404, and a PCB 1410 (an example of PCB 800 in FIG. 8). In the target material sensing arrangement 1400, the metal heat exchanger 1402 does not function as a sensing capacitor terminal. In one example, the sensing capacitor terminals 1406 and 1408 are on opposite sides of the metal heat exchanger 1402 and are isolated from the metal heat exchanger 1402 by space and/or insulative materials (see e.g., FIGS. 2, 6A, and 6B). Also, the sensing capacitor terminal 1408 couples to a sensing channel node 1412 of the PCB 1410, while the sensing capacitor terminal 1406 couples to a GND node 1414 of the PCB 1410.

In FIG. 14B, the target material sensing arrangement 1420 includes sensing capacitor terminals 1426 and 1428, a conduit 1422, and a PCB 1430 (an example of PCB 800 in FIG. 8). In the target material sensing arrangement 1420, the conduit 1422 does not function as a sensing capacitor terminal. In one example, the sensing capacitor terminals 1426 and 1428 are on opposite sides of the conduit 1422 and are isolated from the conduit 1422 by space and/or insulative materials (see e.g., FIGS. 2, 6A, and 6B). Also, the sensing capacitor terminal 1428 couples to a sensing channel node 1432 of the PCB 1430, while the sensing capacitor terminal 1426 couples to a GND node 1434 of the PCB 1430. In some examples, the conduit 1422 is a metallic conduit (e.g., a pipe). In other examples, the conduit 1422 is a non-metallic conduit. Example non-metallic conduits include polyvinyl chloride (PVC) pipes and chlorinated polyvinyl chloride (CPVC) pipes.

Figure 15A:
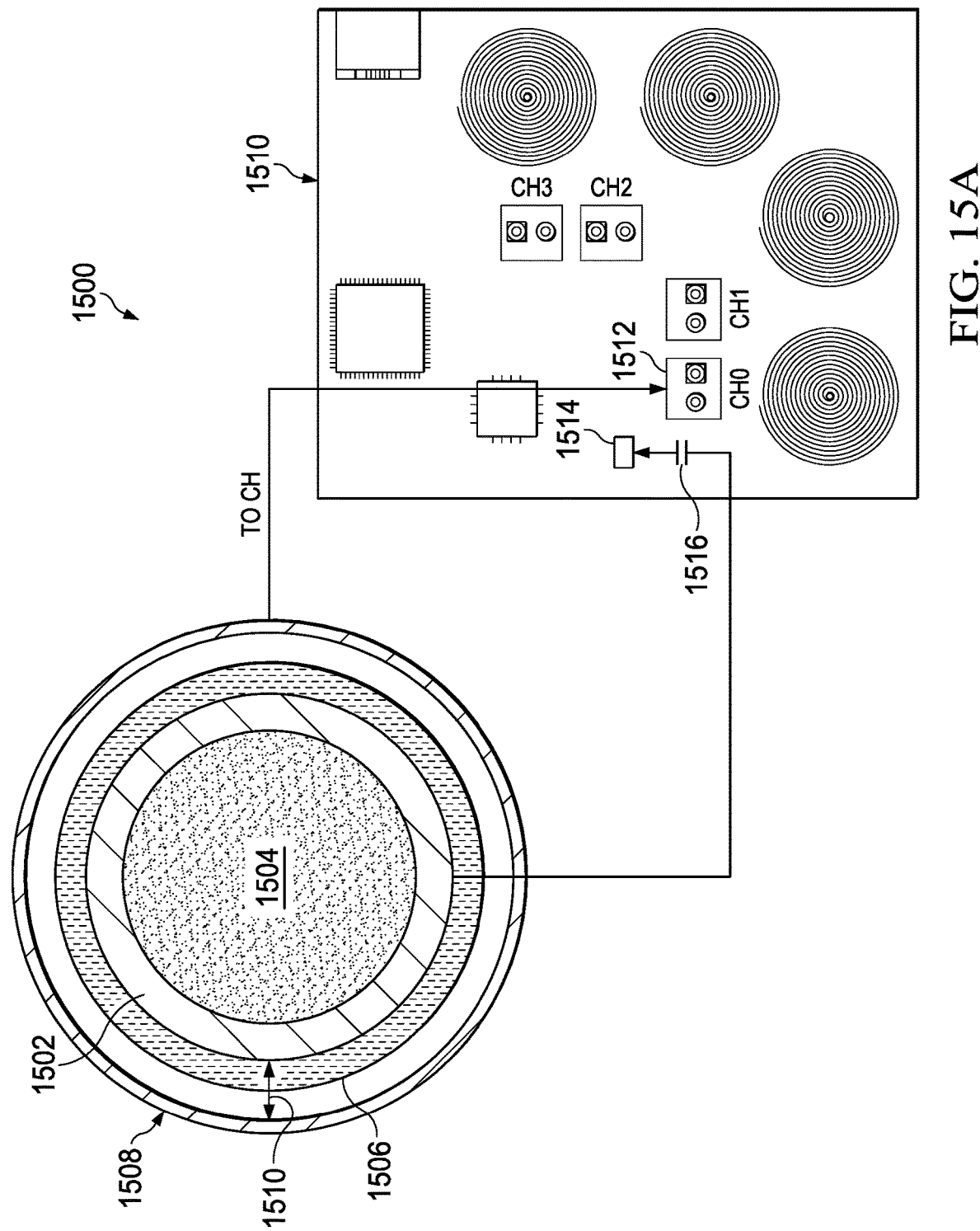
FIG. 15A shows a cross-sectional view of a target material sensing arrangement in accordance with various examples.

FIG. 15A shows a cross-sectional view of a target material sensing arrangement 1500 in accordance with various examples. In the target material sensing arrangement 1500, a conductive element 1502 and a metallic sheath 1508 function as sensing capacitor terminals. The conductive element 1502 conveys a fluid 1504 and represents a metal heat exchanger or metallic conduit. Within a sensing zone 1510 between the conductive element 1502 and the metallic sheath 1508, an increase or decrease of frozen water 1506 causes a capacitance change for the sensing capacitor corresponding to the conductive element 1502 and the metallic sheath 1508. In one example, the metallic sheath 1508 couples to a sensing channel node 1512 of the PCB 1510 (an example of PCB 800 in FIG. 8), while the conductive element 5012 couples to a GND node 1514 of the PCB 1510 via a safety capacitor 1516.

Figure 15B:
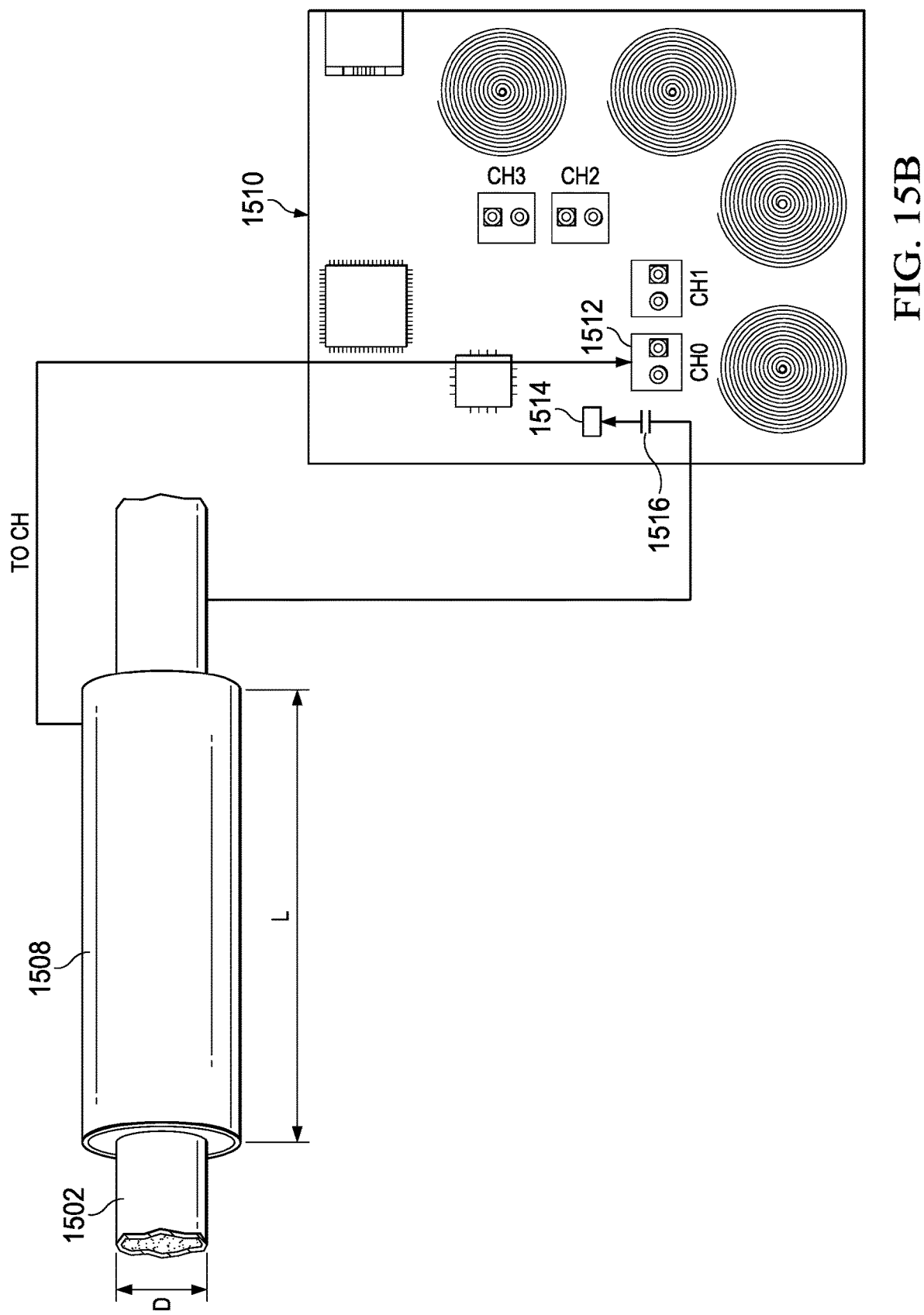
FIG. 15B shows a side view of the target material sensing arrangement of FIG. 15A.

FIG. 15B shows a side view of the target material sensing arrangement 1500 of FIG. 15A. In FIG. 15B, the metallic sheath 1508 has a length, L, and a diameter, D. Adjusting the length and diameter of the metallic sheath 1508 enables adjustments to sensing zone size and target material sensitivity. In some examples, the metallic sheath 1508 is formed from a mesh of metal wires (e.g., a mesh of interconnected copper, stainless steel, and/or aluminum wires).

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present disclosure. Numerous variations and modifications will become apparent to those skilled in the art once the above disclosure is fully appreciated. For example, it should be appreciated that sensing capacitors and related sensing zones do not require a conductive element between the sensing capacitor terminals to function. Accordingly, in various examples, target material sensing (or even just motion detection in a sensing zone) using the disclosed target material sensing components is possible regardless of whether there is a conductive element (e.g., a metal heat exchanger or metal conduit) between the sensing capacitor terminals. Also, in various examples, it should be appreciated that target material sensing is performed continuously or periodically (e.g., once every minute, once every 30 minutes, once an hour, once a day, once a week, once a month). Also, in various examples, target material sensing can involve a sensing capacitor that is not part of a resonant circuit. In such examples, the capacitance of the sensing capacitor is identified and used for target material sensing without resonant frequency analysis. It is intended that the following claims be interpreted to embrace all such variations and modifications.

What is claimed is:

1. A system that comprises:
a conductive element;
a sensing capacitor having a sensing zone between two terminals of the capacitor, and arranged such that an amount of target material in the sensing zone changes a capacitance of the sensing capacitor;
a resonant circuit including the sensing capacitor, wherein at least part of the resonant circuit is electrically isolated from the conductive element;
a resonant circuit analyzer configured to detect a resonant frequency of the resonant circuit and to output a digitized analyzer signal based on the resonant frequency;
a processor coupled to the resonant circuit analyzer, and configured to receive the digitized analyzer signal, to estimate an amount and a phase of a target material using a mathematical function or table responsive to the digitized analyzer signal, and to output a signal representing the target material estimate to an output device.

2. The system of claim 1, wherein opposing terminals of the sensing capacitor are on opposite sides of the conductive element, and wherein each opposing terminal comprises a conductive surface facing the conductive element and an insulative material between the conductive surface and the conductive element.

3. The system of claim 2, wherein the insulative material is a coating applied to each of the opposing terminals of the sensing capacitor.

4. The system of claim 1, wherein the conductive element has at least one conductive surface configured to operate as one of the terminals of the sensing capacitor, and wherein the conductive element is electrically isolated from at least part of the resonant circuit by electrostatic discharge protection circuitry between the conductive element and at least part of the resonant circuit.

5. The system of claim 4, wherein the electrostatic discharge protection circuitry comprises a safety capacitor.

6. The system of claim 5, wherein a size of the safety capacitor is selected based on a predetermined capacitance range for the sensing capacitor.

7. The system of claim 1, wherein the digitized analyzer signal includes at least one of a resonant frequency estimate and a sensing capacitor value estimate.

8. The system of claim 1, wherein the conductive element is a metal heat exchanger of a refrigeration unit, the target material is frozen water, and the output device is a defrost unit.

9. The system of claim 1, wherein the conductive element is a metallic conduit, and wherein the target material is the metallic conduit.

10. The system of claim 1, wherein the output device comprises a printer or display unit configured to display at least one of the target material estimate and an alert message.

11. A refrigeration unit that comprises:
a metal heat exchanger;
a sensing capacitor having a sensing zone between two terminals of the capacitor, and arranged such that an amount of target material in the sensing zone changes a capacitance of the sensing capacitor;
a resonant circuit including the sensing capacitor, wherein the metal heat exchanger is electrically isolated from at least part of the resonant circuit;
a resonant circuit analyzer configured to detect a resonant frequency of the resonant circuit and to output a digitized analyzer signal based on the resonant frequency;
a processor coupled to the resonant circuit analyzer, and configured to receive the digitized analyzer signal and to estimate an amount and a phase of the target material using a mathematical function or table responsive to the digitized analyzer signal; and
a defrost unit configured to receive a control signal from the processor, wherein the control signal is in response to the estimate.

12. The refrigeration unit of claim 11, wherein the processor is configured to provide a start control signal to the defrost unit in response to the estimate.

13. The refrigeration unit of claim 11, wherein the processor provides a stop control signal to the defrost unit in response to the estimate.

14. The refrigeration unit of claim 11, wherein the metal heat exchanger has at least one conductive surface that operates as one of the terminals of the sensing capacitor, and wherein the metal heat exchanger is electrically isolated from at least part of the resonant circuit by electrostatic discharge protection circuitry between the metal heat exchanger and at least part of the resonant circuit.

15. The refrigeration unit of claim 11, wherein the terminals of the sensing capacitor are on opposite sides of the metal heat exchanger, and wherein each terminal comprises a conductive surface facing the metal heat exchanger and an insulative material between the conductive surface and the metal heat exchanger.

16. An apparatus that comprises:
a sensing capacitor with two terminals and a sensing zone between the two terminals, wherein variance of a target material in the sensing zone changes a capacitance of the sensing capacitor,
a metallic conduit to convey fluid; and
at least one printed circuit board (PCB) comprising:
a ground node;
a sensing channel node;
at least one LC component coupled to the sensing channel node to complete a resonant circuit that includes the sensing capacitor, wherein the metallic conduit is electrically isolated from the ground node and the sensing channel node;
a resonant circuit analyzer configured to track a resonant frequency of the resonant circuit as a function of time and to output digitized analyzer signals based on the tracked resonant frequency as a function of time; and
a processor coupled to the resonant circuit analyzer, and configured to receive the digitized analyzer values and to estimate an amount and a phase of a target material using a mathematical function or table responsive to the digitized analyzer values.

17. The apparatus of claim 16, further comprising a display device in communication with the processor, wherein the display device presents the determined target material estimate or related message.

18. The apparatus of claim 16, further comprising a target material removal unit in communication with the processor, wherein the processor provides start and stop control signals to the target material removal unit based on determined target material estimates.

19. The apparatus of claim 16, wherein the metallic conduit has at least one conductive surface that operates as one of the terminals of the sensing capacitor, and wherein the metallic conduit is electrically isolated from the ground node by a safety capacitor in series between the metallic conduit and the ground node.

20. The apparatus of claim 16, wherein the terminals of the sensing capacitor are on opposite sides of the metallic conduit, wherein at least one of the terminals comprises a conductive surface facing the metallic conduit and an insulative material between the conductive surface and the metallic conduit, and wherein one of the terminals of the sensing capacitor couples to the sensing channel node and the other terminal of the sensing capacitor couples to the ground node.

* * * * *